(12) United States Patent
Iriguchi

(10) Patent No.: US 8,610,470 B2
(45) Date of Patent: Dec. 17, 2013

(54) INVERTER CIRCUIT

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 490 days.

(21) Appl. No.: 12/654,025

(22) Filed: Dec. 8, 2009

(65) Prior Publication Data

US 2010/0188144 A1   Jul. 29, 2010

(30) Foreign Application Priority Data

Dec. 10, 2008  (JP) .................................. 2008-314508
Mar. 26, 2009  (JP) .................................. 2009-075901

(51) Int. Cl.
 *H03B 1/00* (2006.01)
(52) U.S. Cl.
 USPC .......................................................... 327/112
(58) Field of Classification Search
 USPC .................................................. 327/566, 112
 See application file for complete search history.

(56) References Cited

U.S. PATENT DOCUMENTS

| | | | |
|---|---|---|---|
| 4,740,713 A | 4/1988 | Sakurai et al. | |
| 4,857,763 A | 8/1989 | Sakurai et al. | |
| 5,231,319 A * | 7/1993 | Crafts et al. | 327/277 |
| 6,081,152 A * | 6/2000 | Maley | 327/320 |
| 6,104,218 A | 8/2000 | Ueno | |
| 6,580,306 B2 * | 6/2003 | Hardee | 327/328 |
| 6,693,469 B2 * | 2/2004 | Prodanov | 327/108 |
| 7,205,807 B2 | 4/2007 | Svensson et al. | |
| 7,239,181 B2 | 7/2007 | Himi et al. | |
| 7,495,483 B2 * | 2/2009 | Kumar et al. | 327/112 |

FOREIGN PATENT DOCUMENTS

| | | |
|---|---|---|
| JP | A-61-172435 | 8/1986 |
| JP | A-10-190426 | 7/1998 |
| JP | A-10-223905 | 8/1998 |
| JP | A-2001-102915 | 4/2001 |
| JP | A-2001-102916 | 4/2001 |
| JP | A-2003-324343 | 11/2003 |
| JP | A-2006-148058 | 6/2006 |
| JP | A-2007-281196 | 10/2007 |

* cited by examiner

*Primary Examiner* — Hai L Nguyen
(74) *Attorney, Agent, or Firm* — Oliff & Berridge, PLC

(57) ABSTRACT

The present invention provides a semiconductor integrated circuit capable of achieving high voltage. The proposed semiconductor integrated circuit includes a first node [VOUT] connected to a first potential node [VDD], and a first n-channel transistor [NT1] and a second n-channel transistor [NT2] serially connected between a first node [VOUT] and a second potential node [VSS] of a lower potential than the first potential node. One end of NT1 is connected to the second potential node [VSS], the other end thereof is connected to one end of the second n-channel transistor [NT2], a gate terminal thereof is connected to a second node [VIN], the other end of NT2 is connected to the first node [VOUT], and a gate terminal thereof is connected to a first intermediate range potential [VM1] positioned between the first potential node [VDD] and the second potential node [VSS].

6 Claims, 21 Drawing Sheets

VDD>VM2>VM1>VSS ··· (1)

FIG. 3
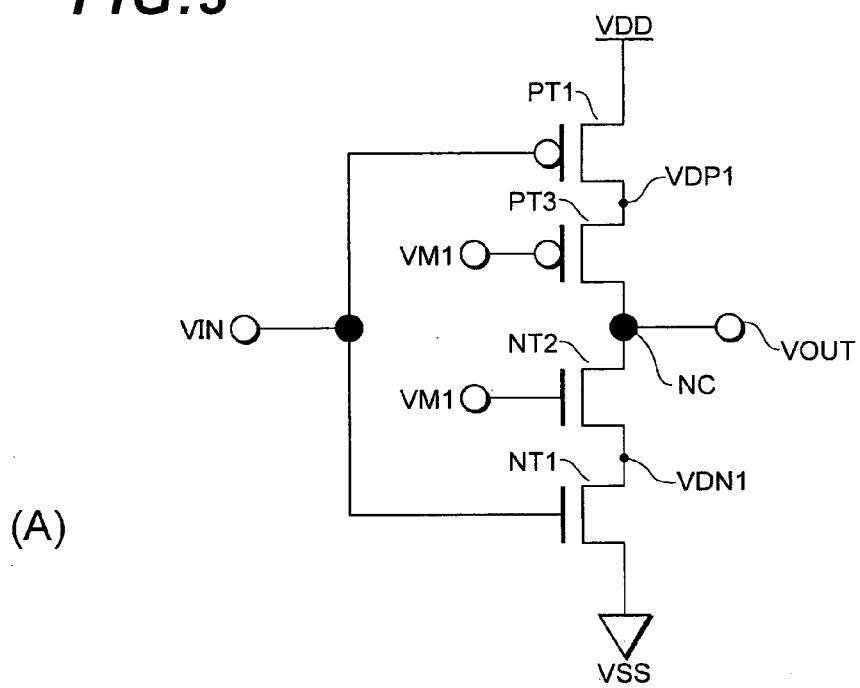
(A)
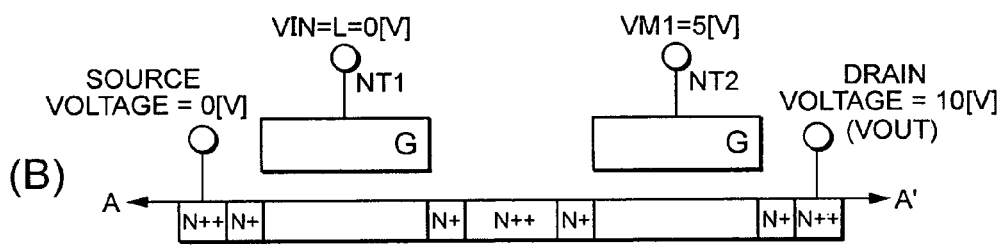
(B)
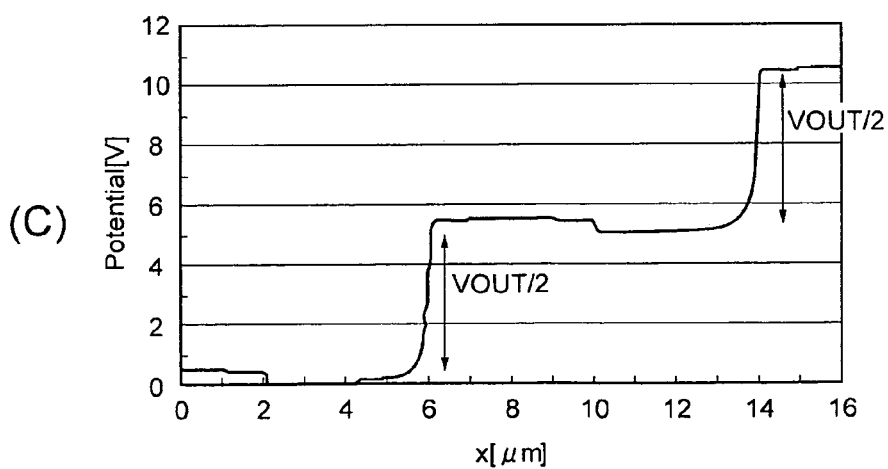
(C)

FIG.5
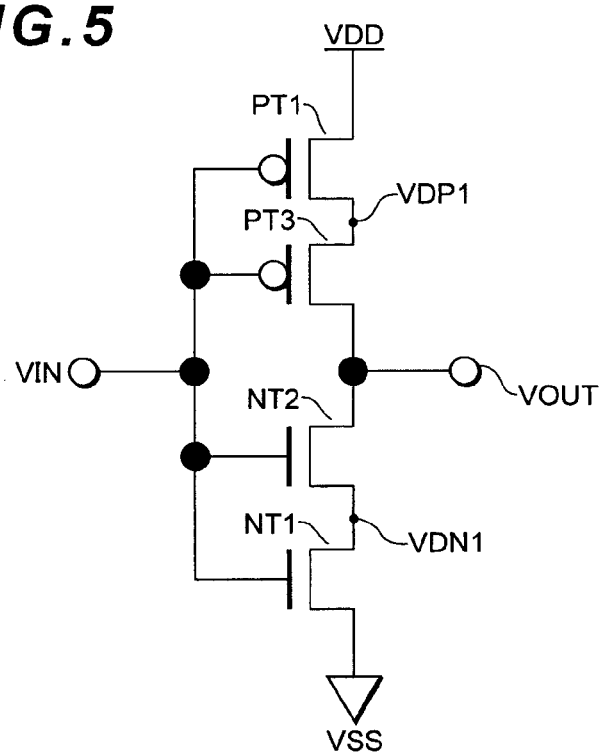
FIG.6
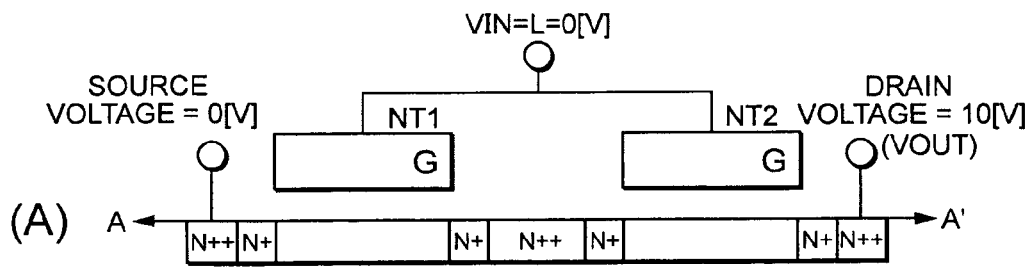
(A)
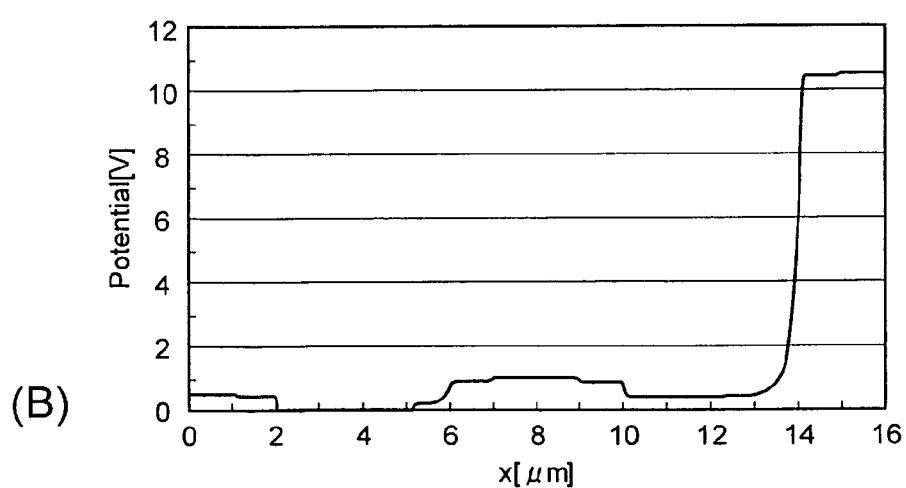
(B)

FIG. 10
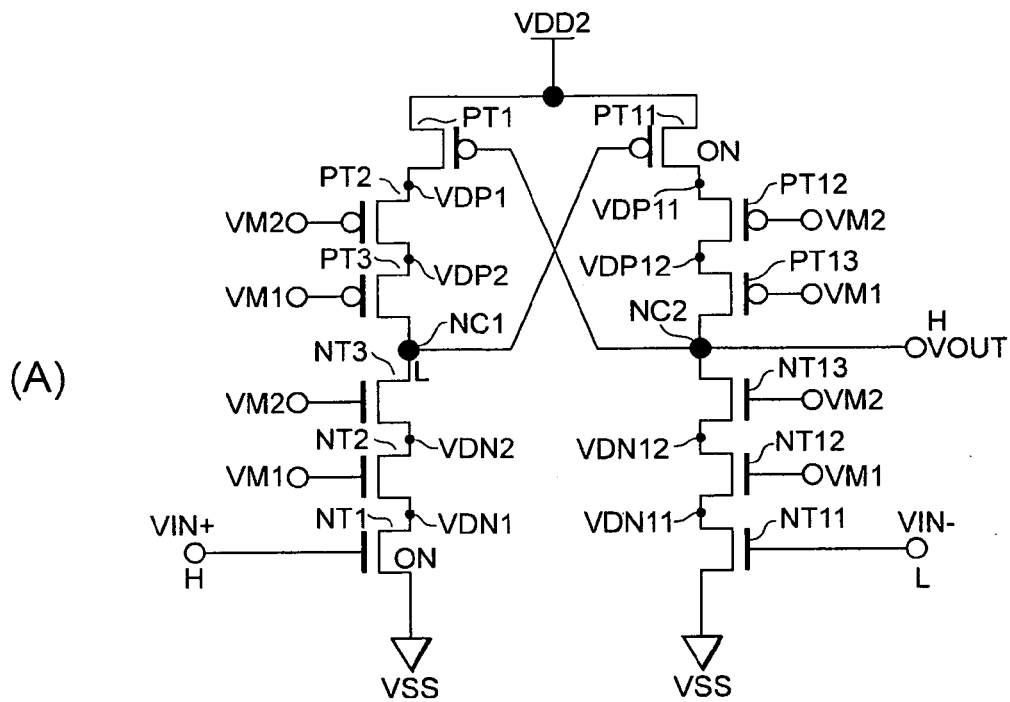
(A)
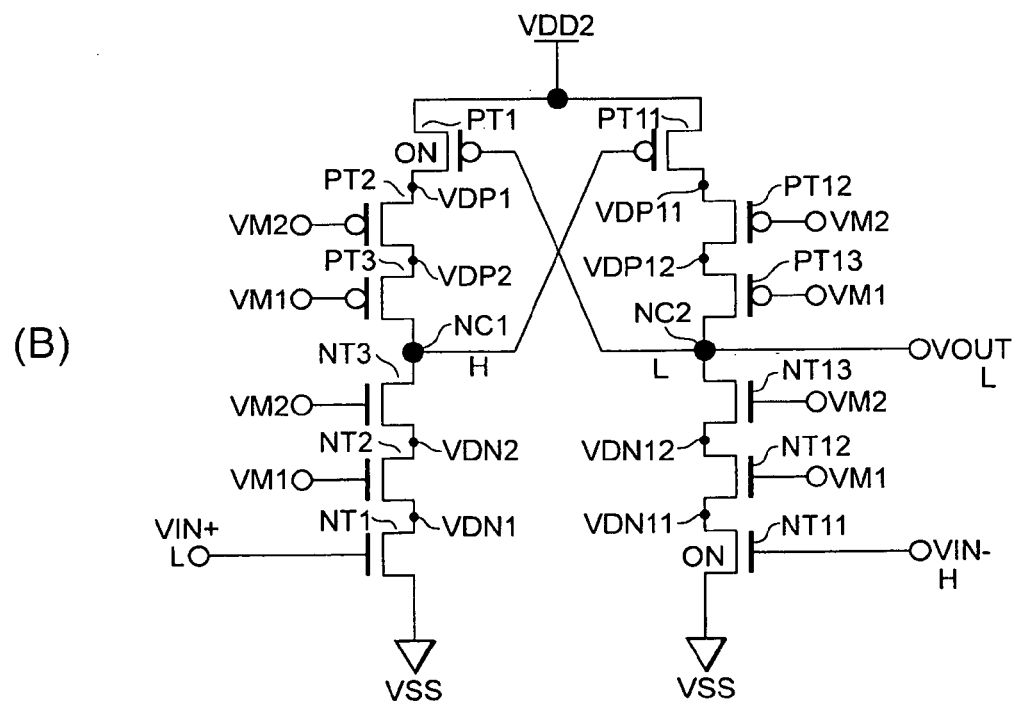
(B)

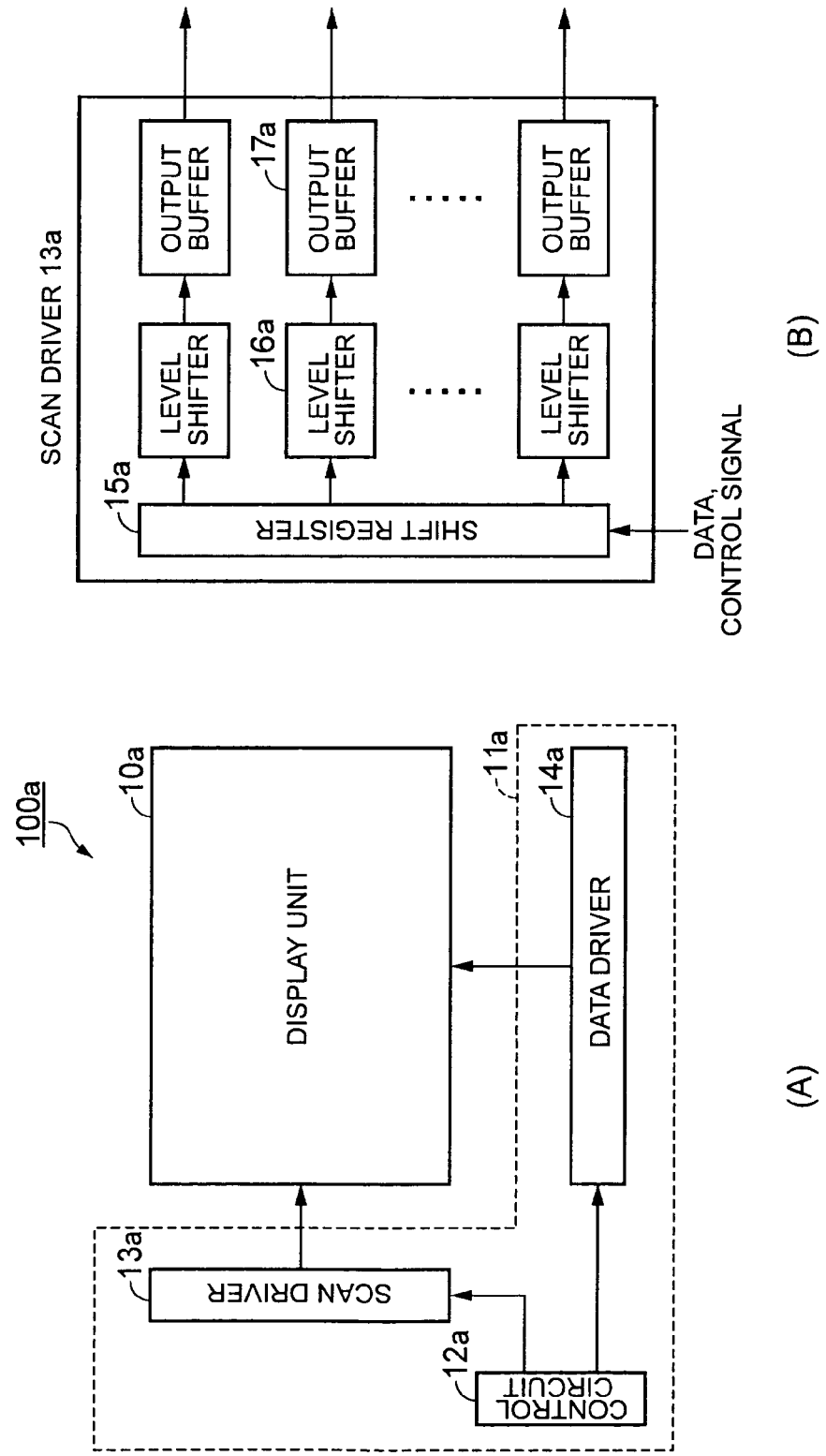

INVERTER CIRCUIT

CROSS-REFERENCES TO RELATED APPLICATIONS

This application relates to and claims priority from Japanese Patent Application No. 2008-314508, filed on Dec. 10, 2008, and from Japanese Patent Application No. 2009-075901, filed on Mar. 26, 2009, the entire disclosure of which is incorporated herein by reference.

BACKGROUND

1. Technical Field

The present invention relates to a semiconductor integrated circuit, a method for driving a semiconductor integrated circuit, a method for driving an electronic apparatus, a display device, and an electronic apparatus.

2. Related Art

<First Background Art>

A polysilicon thin film transistor (TFT) is used as a backplane of display devices such as a liquid crystal display device. For instance, a display unit (active matrix unit) or a drive circuit unit that is disposed at the periphery thereof is configured from a thin film transistor. A thin film transistor can be formed from a relatively low-temperature process, and is an important device in seeking the low cost of devices.

Meanwhile, a drive circuit is sometimes demanded of achieving a high voltage of control signals in light of the various controls to be performed. A high potential signal input unit of a booster circuit or a buck circuit is required to have a high voltage.

For example, Japanese Patent Application Laid-open No. H10-223905 discloses a circuit in which NMOS or PMOS transistors with an LDD structure are cascade-connected, and input signals are commonly connected to their gate electrodes.

<Second Background Art>

A thin film transistor (TFT) is used as a backplane of display devices such as a liquid crystal display device. For instance, a display unit (active matrix unit) or a drive circuit unit that is disposed at the periphery thereof is configured from a TFT. Moreover, if a pixel circuit of the display unit is formed with an organic TFT using an organic thin film semiconductor, and a drive circuit formed with a low-temperature polysilicon TFT is mounted in the periphery thereof, a large display device that leverages the characteristics of both TFTs can be realized at a low cost. Nevertheless, a drive voltage of 30[V] to 40[V] is generally required to drive the organic TFT, and the booster circuit and the drive output unit in the drive circuit are required to have a high voltage.

For instance, Japanese Patent Application Laid-open No. 2001-102915 discloses a high voltage signal line drive circuit configured from transistors with low voltage (refer to FIG. 11A and FIG. 11B).

SUMMARY

Nevertheless, as a result of intense study by the inventors, it has been discovered that, even if NMOS or PMOS transistors in which input signals are commonly connected to a gate electrode are cascade-connected, the voltage applied to the respective transistors is not level, and excessive voltage still tends to be applied to the transistor that is connected farthest from the power source potential (VDD) or the grounding potential (VSS); that is, the transistor is connected directly to the output line VOUT.

In addition, even when adopting an LDD structure that is effective as a means for achieving high voltage; that is, a means for buffering the applied electrical field, the electrical field buffering effect is small in a thin film transistor having low-temperature polysilicon in its semiconductor layer. The reason for this is because the impurity concentration of the LDD structural part cannot be set low.

Specifically, the electrical field buffering effect will become greater if the impurity concentration of the LDD structural part is set low, but the lower limit thereof is approximately several times the residual defect density of the layer that is used as the semiconductor layer (channel layer). In particular, a thin film transistor using low-temperature polysilicon has a high residual defect density at 1017/cm2 or less, and the impurity concentration of the LDD structural part cannot be set low. Thus, there is a limit to the electrical field buffering effect based on the LDD structure.

Thus, an object of the present invention is to provide a semiconductor integrated circuit and its drive method and the like capable of achieving high voltage.

The semiconductor integrated circuit according to the present invention comprises a first node coupled to a first potential node, and a first n-channel transistor and a second n-channel transistor serially coupled between the first node and a second potential node of a lower potential than the first potential node. With this semiconductor integrated circuit, one end of the first n-channel transistor is coupled to the second potential node, the other end thereof is coupled to one end of the second n-channel transistor, a gate terminal thereof is coupled to a second node, the other end of the second n-channel transistor is coupled to the first node, and a gate terminal thereof is coupled to a first intermediate range potential positioned between the first potential node and the second potential node.

According to the foregoing configuration, voltage is divided by the second n-channel transistor in which a gate terminal is coupled to an intermediate range potential, and the maximum voltage that is applied to the respective transistors can be reduced. Here, the term "couple" includes, regardless of whether it is direct coupling or indirect coupling, electrical coupling via another element (a transistor, for example) to the extent that it does not deviate from the gist of this invention.

For example, the semiconductor integrated circuit further comprises a third n-channel transistor coupled between the first node and the other end of the second n-channel transistor, and a gate terminal of the third n-channel transistor is positioned between the first potential and the second potential, and coupled to a second intermediate range potential that is higher than the first intermediate range potential.

According to the foregoing configuration, voltage is divided in multiple stages by the second and third n-channel transistors, and the maximum voltage that is applied to the respective transistors can be reduced.

The semiconductor integrated circuit according to the present invention comprises a first node coupled to a second potential node, and a first p-channel transistor and a second p-channel transistor serially coupled between the first node and a first potential node of a higher potential than the second potential node. With this semiconductor integrated circuit, one end of the first p-channel transistor is coupled to the first potential, the other end thereof is coupled to one end of the second p-channel transistor, a gate terminal thereof is coupled to a second node, the other end of the second p-channel transistor is coupled to the first node, and a gate terminal thereof is coupled to a first intermediate range potential positioned between the first potential and the second potential.

According to the foregoing configuration, voltage is divided by the second p-channel transistor in which a gate terminal is coupled to an intermediate range potential, and the maximum voltage that is applied to the respective transistors can be reduced.

For example, the semiconductor integrated circuit further comprises a third p-channel transistor coupled between the first node and the other end of the second p-channel transistor, and a gate terminal of the third p-channel transistor is positioned between the first potential and the second potential, and coupled to a second intermediate range potential that is lower than the first intermediate range potential.

According to the foregoing configuration, voltage is divided in multiple stages by the second and third p-channel transistors, and the maximum voltage that is applied to the respective transistors can be reduced. For example, the semiconductor integrated circuit further comprises a first p-channel transistor and a second p-channel transistor serially coupled between the first node and the first potential node, one end of the first p-channel transistor is coupled to the first potential node, the other end thereof is coupled to one end of the second p-channel transistor, a gate terminal thereof is coupled to the second node, the other end of the second p-channel transistor is coupled to the first node, and a gate terminal thereof is coupled to a third intermediate range potential positioned between the first potential and the second potential.

The inverter may also be configured as described above. According to the foregoing configuration, voltage is divided evenly by the second p-channel transistor, and the maximum voltage that is applied to the respective p-channel transistors can be reduced.

For example, the semiconductor integrated circuit further comprises a third p-channel transistor coupled between the first node and the other end of the second p-channel transistor, and a gate terminal of the third p-channel transistor is positioned between the first potential and the second potential, and coupled to a fourth intermediate range potential that is lower than the third intermediate range potential.

According to the foregoing configuration, voltage is divided in multiple stages by the second and third p-channel transistors, and the maximum voltage that is applied to the respective p-channel transistors can be reduced.

The semiconductor integrated circuit according to the present invention comprises: four drive transistors including a first p-channel transistor and a first n-channel transistor, and a second p-channel transistor and a second n-channel transistor that are coupled in parallel between a first potential and a second potential of a lower potential than the first potential, wherein one end of the first p-channel transistor is coupled to the first potential, the other end thereof is coupled to a first node, a gate terminal thereof is coupled to a second node, one end of the second p-channel transistor is coupled to the first potential, the other end thereof is coupled to the second node, a gate terminal thereof is coupled to the first node, one end of the first n-channel transistor is coupled to the first node, the other end thereof is coupled to the second potential node, a gate terminal thereof is coupled to a third node, one end of the second n-channel transistor is coupled to the second node, the other end thereof is coupled to the second potential node, and a gate terminal thereof is coupled to a fourth node; and at least one voltage-dividing transistor among four voltage-dividing transistors including a third p-channel transistor coupled between the other end of the first p-channel transistor and the first node, a fourth p-channel transistor coupled between the other end of the second p-channel transistor and the second node, a third n-channel transistor coupled between one end of the first n-channel transistor and the first node, and a fourth n-channel transistor coupled between one end of the second n-channel transistor and the second node, wherein a gate termination of the voltage-dividing transistor is coupled to an intermediate range potential positioned between the first potential and the second potential.

According to the foregoing configuration, voltage is divided by either the third and fourth n-channel transistors or the third and fourth p-channel transistors in which a gate terminal is coupled to an intermediate range potential, and the maximum voltage that is applied to the respective transistors to which a high potential is applied can be reduced.

For example, the semiconductor integrated circuit further comprises the third p-channel transistor among the voltage-dividing transistors and a fifth p-channel transistor coupled between the third p-channel transistor and the first node, and the third p-channel transistor is coupled to a first intermediate range potential positioned between the first potential and the second potential, and the fifth p-channel transistor is positioned between the first potential and the second potential, and coupled to a second intermediate range potential that is lower than the first intermediate range potential.

According to the foregoing configuration, voltage is divided in multiple stages by the third and fifth p-channel transistors, and the maximum voltage that is applied to the first, third and fifth p-channel transistors can be reduced.

For example, the semiconductor integrated circuit further comprises the fourth n-channel transistor among the voltage-dividing transistors and a sixth p-channel transistor coupled between the fourth p-channel transistor and the second node, and the fourth p-channel transistor is coupled to a first intermediate range potential positioned between the first potential and the second potential, and the sixth p-channel transistor is positioned between the first potential and the second potential, and coupled to a second intermediate range potential that is higher than the first intermediate range potential.

According to the foregoing configuration, voltage is divided in multiple stages by the fourth and sixth p-channel transistors, and the maximum voltage that is applied to the second, fourth and sixth p-channel transistors can be reduced.

For example, the semiconductor integrated circuit further comprises the third n-channel transistor among the voltage-dividing transistors and a fifth n-channel transistor coupled between the third n-channel transistor and the first node, and the third n-channel transistor is coupled to a first intermediate range potential positioned between the first potential and the second potential, and the fifth n-channel transistor is positioned between the first potential and the second potential, and coupled to a second intermediate range potential that is higher than the first intermediate range potential.

According to the foregoing configuration, voltage is divided in multiple stages by the third and fifth n-channel transistors, and the maximum voltage that is applied to the first, third and fifth n-channel transistors can be reduced.

For example, the semiconductor integrated circuit further comprises the fourth n-channel transistor among the voltage-dividing transistors and a sixth n-channel transistor coupled between the fourth n-channel transistor and the second node, and the fourth n-channel transistor is coupled to a first intermediate range potential positioned between the first potential and the second potential, and the sixth n-channel transistor is positioned between the first potential and the second potential, and coupled to a second intermediate range potential that is higher than the first intermediate range potential.

According to the foregoing configuration, voltage is divided in multiple stages by the fourth and sixth p-channel transistors, and the maximum voltage that is applied to the second, fourth and sixth p-channel transistors can be reduced.

For example, the transistor is a thin film transistor. If a thin film transistor is used, the necessity to reinforce the voltage resistance based voltage dividing is high.

The method for driving a semiconductor integrated circuit according to the present invention is a method for driving a semiconductor integrated circuit including a first node coupled to a first potential node, and a first n-channel transistor and a second n-channel transistor serially coupled between the first node and a second potential node of a lower potential than the first potential node, wherein one end of the first n-channel transistor is coupled to the second potential node, the other end thereof is coupled to one end of the second n-channel transistor, and the other end of the second n-channel transistor is coupled to the first node. This method comprises a step of applying a first intermediate range potential positioned between the first potential and the second potential to a gate terminal of the second n-channel transistor upon outputting a signal of a high potential level from the first node when a signal input to a gate terminal of the first n-channel transistor has a low potential level.

As a result of applying an intermediate range potential to the second n-channel transistor, the voltage that is applied to the respective transistors can be reduced.

For example, the semiconductor integrated circuit further includes a third n-channel transistor coupled between the first node and the other end of the second n-channel transistor, and the method further comprises a step of applying a second intermediate range potential that is higher than the first intermediate range potential and positioned between the first potential and the second potential to a gate terminal of the third n-channel transistor upon outputting the signal of a high potential level.

As a result of sequentially applying a high intermediate range potential to the second and third n-channel transistors in multiple stages, the maximum voltage that is applied to the respective transistors can be reduced.

The method for driving a semiconductor integrated circuit according to the present invention is a method for driving a semiconductor integrated circuit including a first node coupled to a second potential node, and a first p-channel transistor and a second p-channel transistor serially coupled between the first node and a first potential node of a higher potential than the second potential node, wherein one end of the first p-channel transistor is coupled to the first potential, the other end thereof is coupled to one end of the second p-channel transistor, and the other end of the second p-channel transistor is coupled to the first node. This method comprises a step of applying a first intermediate range potential positioned between the first potential and the second potential to a gate terminal of the second p-channel transistor upon outputting a signal of a low potential level from the first node when a signal input to a gate terminal of the first p-channel transistor has a high potential level.

As a result of applying an intermediate range potential to the second p-channel transistor, the voltage that is applied to the respective transistors can be reduced.

For example, the semiconductor integrated circuit further includes a third p-channel transistor coupled between the first node and the other end of the second p-channel transistor, and the method further comprises a step of applying a second intermediate range potential that is lower than the first intermediate range potential and positioned between the first potential and the second potential to a gate terminal of the third p-channel transistor upon outputting the signal of a low potential level.

As a result of sequentially applying a low intermediate range potential to the second and third p-channel transistors in multiple stages, the maximum voltage that is applied to the respective transistors can be reduced.

The method for driving a semiconductor integrated circuit according to the present invention is a method for driving a semiconductor integrated circuit including: four drive transistors including a first p-channel transistor and a first n-channel transistor, and a second p-channel transistor and a second n-channel transistor that are coupled in parallel between a first potential and a second potential of a lower potential than the first potential, wherein one end of the first p-channel transistor is coupled to the first potential, the other end thereof is coupled to a first node, a gate terminal thereof is coupled to a second node, one end of the second p-channel transistor is coupled to the first potential, the other end thereof is coupled to the second node, a gate terminal thereof is coupled to the first node, one end of the first n-channel transistor is coupled to the first node, the other end thereof is coupled to the second potential node, a gate terminal thereof is coupled to a third node, one end of the second n-channel transistor is coupled to the second node, the other end thereof is coupled to the second potential node, and a gate terminal thereof is coupled to a fourth node; and four voltage-dividing transistors including a third p-channel transistor coupled between the other end of the first p-channel transistor and the first node, a fourth p-channel transistor coupled between the other end of the second p-channel transistor and the second node, a third n-channel transistor coupled between one end of the first n-channel transistor and the first node, and a fourth n-channel transistor coupled between one end of the second n-channel transistor and the second node. This method comprises a step of applying an intermediate range potential positioned between the first potential and the second potential to a gate terminal of the third p-channel transistor and fourth n-channel transistor upon outputting a signal of a low potential level from the second node when a signal input to the first n-channel transistor has a high potential level.

As a result of applying an intermediate range potential to the fourth n-channel transistor and the third p-channel transistor, the maximum voltage that is applied to the respective transistors can be reduced.

The method for driving a semiconductor integrated circuit according to the present invention is a method for driving a semiconductor integrated circuit including: four drive transistors including a first p-channel transistor and a first n-channel transistor, and a second p-channel transistor and a second n-channel transistor that are coupled in parallel between a first potential and a second potential of a lower potential than the first potential, wherein one end of the first p-channel transistor is coupled to the first potential, the other end thereof is coupled to a first node, a gate terminal thereof is coupled to a second node, one end of the second p-channel transistor is coupled to the first potential, the other end thereof is coupled to the second node, a gate terminal thereof is coupled to the first node, one end of the first n-channel transistor is coupled to the first node, the other end thereof is coupled to the second potential node, a gate terminal thereof is coupled to a third node, one end of the second n-channel transistor is coupled to the second node, the other end thereof is coupled to the second potential node, and a gate terminal thereof is coupled to a fourth node; and four voltage-dividing transistors including a third p-channel transistor coupled between the other end of the first p-channel transistor and the first node, a fourth p-channel transistor coupled between the other end of the second p-channel transistor and the second node, a third n-channel transistor coupled between one end of the first n-channel transistor and the first node, and a fourth n-channel transistor coupled between one end of the second n-channel transistor and the second node. This method comprises a step of applying an intermediate range potential positioned between the first potential and the second potential to a gate terminal of the fourth p-channel transistor and the third n-channel transistor upon outputting a signal of a low potential level from the second node when a signal input to the second n-channel transistor has a high potential level.

As a result of applying an intermediate range potential to the third n-channel transistor and the fourth p-channel transistor, the maximum voltage that is applied to the respective transistors can be reduced.

The electronic apparatus according to the present invention comprises the foregoing semiconductor integrated circuit. According to the foregoing configuration, characteristics of the electronic apparatus can be improved.

The method for driving an electronic apparatus according to the present invention comprises the foregoing method for driving a semiconductor integrated circuit. According to the foregoing configuration, the electronic apparatus can be driven favorably.

The present invention can also be realized as the following application or mode for overcoming at least one of the problems indicated in the third embodiment described later.

[Application 1] The semiconductor integrated circuit described in this application is characterized in comprising a first node coupled to a first potential node, and a first n-channel transistor, a second n-channel transistor and a third n-channel transistor serially coupled between the first node and a second potential node of a lower potential than the first potential node, wherein one end of the first n-channel transistor is coupled to the second potential node, the other end thereof is coupled to one end of the second n-channel transistor, a gate terminal thereof is coupled to a second node, the other end of the second n-channel transistor is coupled to one end of the third n-channel transistor, a gate terminal thereof is coupled to a first intermediate range potential node with a potential between the first potential node and the second potential node, the other end of the third n-channel transistor is coupled to the first node, and a gate terminal thereof is coupled to the first potential node.

According to the foregoing configuration, voltage of a first node is divided in multiple stages by a first n-channel transistor in which a gate terminal is coupled to a second node, a second n-channel transistor in which a gate terminal is coupled to an intermediate range potential, and a third n-channel transistor in which a gate terminal is fixed to a first potential, and the maximum voltage that is applied to the respective transistors can be reduced.

[Application 2] The semiconductor integrated circuit described in this application is characterized in comprising a first node coupled to a second potential node, and a first p-channel transistor, a second p-channel transistor and a third p-channel transistor serially coupled between the first node and a first potential node of a higher potential than the second potential node, wherein one end of the first p-channel transistor is coupled to the first potential node, the other end thereof is coupled to one end of the second p-channel transistor, a gate terminal thereof is coupled to a second node, the other end of the second p-channel transistor is coupled to one end of the third p-channel transistor, a gate terminal thereof is coupled to a first intermediate range potential node with a potential between the first potential node and the second potential node, the other end of the third p-channel transistor is coupled to the first node, and a gate terminal thereof is coupled to the second potential node.

According to the foregoing configuration, voltage of a first node is divided in multiple stages by a first p-channel transistor in which a gate terminal is coupled to a second node, and a second p-channel transistor and a third p-channel transistor in which a gate terminal is coupled to an intermediate range potential, and the maximum voltage that is applied to the respective transistors can be reduced.

[Application 3] The semiconductor integrated circuit described in the foregoing application is characterized in further comprising a first p-channel transistor, a second p-channel transistor, and a third p-channel transistor serially coupled between the first node and the first potential node, a third node, and a fourth p-channel transistor, a fifth p-channel transistor and a sixth p-channel transistor serially coupled between the third node and the first potential node, wherein one end of the first p-channel transistor is coupled to the first potential node, the other end thereof is coupled to one end of the second p-channel transistor, a gate terminal thereof is coupled to the third node, the other end of the second p-channel transistor is coupled to one end of the third p-channel transistor, a gate terminal thereof is coupled to a first intermediate range potential node with a potential between the first potential node and the second potential node, the other end of the third p-channel transistor is coupled to the first node, a gate terminal thereof is coupled to the second potential node, one end of the fourth p-channel transistor is coupled to the first potential node, the other end thereof is coupled to one end of the fifth p-channel transistor, a gate terminal thereof is coupled to the first node, the other end of the fifth p-channel transistor is coupled to one end of the sixth p-channel transistor, a gate terminal thereof is coupled to the first intermediate range potential node, the other end of the sixth p-channel transistor is coupled to the third node, and a gate terminal thereof is coupled to the second potential node.

According to the foregoing configuration, the potential that is applied between the source and drain of a first p-channel transistor and between the source and drain of a second p-channel transistor is evenly divided, and the potential that is applied between the source and drain of a third p-channel transistor and between the source and drain of a fourth p-channel transistor is also evenly divided, and the maximum voltage that is applied between the source and drain of the respective transistors can be reduced.

[Application 4] The semiconductor integrated circuit described in the foregoing application is characterized in that the first p-channel transistor, the second p-channel transistor, the third p-channel transistor, the first n-channel transistor, the second n-channel transistor, and the third n-channel transistor are thin film transistors.

According to the foregoing configuration, a semiconductor integrated circuit can be manufactured easily and inexpensively.

[Application 5] The semiconductor integrated circuit described in the foregoing application is characterized in that a semiconductor layer of the first p-channel transistor, the second p-channel transistor, the third p-channel transistor, the first n-channel transistor, the second n-channel transistor, and the third n-channel transistor is formed from polysilicon.

According to the foregoing configuration, a semiconductor integrated circuit can be easily manufactured using well-known film formation methods and devices.

[Application 6] The method for driving a semiconductor integrated circuit described in this application is characterized in that it is a method for driving a semiconductor integrated circuit including a first node coupled to a first potential node, and a first n-channel transistor, a second n-channel transistor and a third n-channel transistor serially coupled between the first node and a second potential node of a lower potential than the first potential node, wherein one end of the first n-channel transistor is coupled to the second potential node, the other end thereof is coupled to one end of the second n-channel transistor, the other end of the second n-channel transistor is coupled to one end of the third n-channel transistor, and the other end of the third n-channel transistor is coupled to the first node. This method is characterized in comprising a step of applying a potential of the first potential node to a gate terminal of the third n-channel transistor and additionally applying a first intermediate range potential with a potential between the first potential node and the second potential node to a gate terminal of the second n-channel transistor upon inputting a signal to a gate terminal of the first n-channel transistor and outputting a signal from the first node.

According to the foregoing drive method, upon inputting a signal of a low level or a high level to a gate terminal of a first n-channel transistor and changing a signal of the first node to a high level or a low level, regardless of the size of the load coupled to a first node, voltage is divided in multiple stages by a first n-channel transistor, a second n-channel transistor and a third n-channel transistor, and the maximum voltage that is applied to the respective transistors can be reduced.

[Application 7] The method for driving a semiconductor integrated circuit described in this application is characterized in that it is a method for driving a semiconductor integrated circuit including a first node coupled to a second potential node, and a first p-channel transistor, a second p-channel transistor and a third p-channel transistor serially coupled between the first node and a first potential node of a higher potential than the second potential node, wherein one end of the first p-channel transistor is coupled to the first potential node, the other end thereof is coupled to one end of the second p-channel transistor, the other end of the second p-channel transistor is coupled to one end of the third p-channel transistor, and the other end of the third p-channel transistor is coupled to the first node. This method is characterized in comprising a step of applying a potential of the second potential node to a gate terminal of the third p-channel transistor and additionally applying a first intermediate range potential with a potential between the first potential node and the second potential node to a gate terminal of the second p-channel transistor upon inputting a signal to a gate terminal of the first p-channel transistor and outputting a signal from the first node.

According to the foregoing drive method, upon inputting a signal of a low level or a high level to a gate terminal of a first p-channel transistor and changing a signal of the first node to a high level or a low level, regardless of the size of the load coupled to a first node, voltage is divided in multiple stages by a first p-channel transistor, a second p-channel transistor and a third p-channel transistor, and the maximum voltage that is applied to the respective transistors can be reduced.

[Application 8] The method for driving an electronic apparatus described in this application is characterized in comprising the method for driving a semiconductor integrated circuit described in the foregoing application.

According to the foregoing configuration, an electronic apparatus can be driven favorably.

[Application 9] The display device described in this application is characterized in comprising the semiconductor integrated circuit described in the foregoing application.

According to the foregoing configuration, a display device can be manufactured easily and inexpensively.

[Application 10] An electronic apparatus characterized in comprising the display device described in the foregoing application.

BRIEF DESCRIPTION OF THE DRAWINGS

FIG. 3A, FIG. 3C and FIG. 3C are respectively a circuit diagram showing another configuration of the inverter circuit of the first embodiment, a cross section thereof, and a diagram showing the potential that is applied to the respective transistors;

FIG. 5 is a circuit diagram showing the circuit configuration of the comparative example;

FIG. 6A and FIG. 6B are respectively a cross section of the circuit of the comparative example and a diagram showing the potential that is applied to the respective transistors;

FIG. 10A and FIG. 10B are diagrams showing the operation of the level shifter circuit of the second embodiment;

FIG. 26A and FIG. 26B are schematic diagrams showing an example of a display device comprising the semiconductor integrated circuit.

DESCRIPTION OF EXEMPLARY EMBODIMENTS

Figure 1:
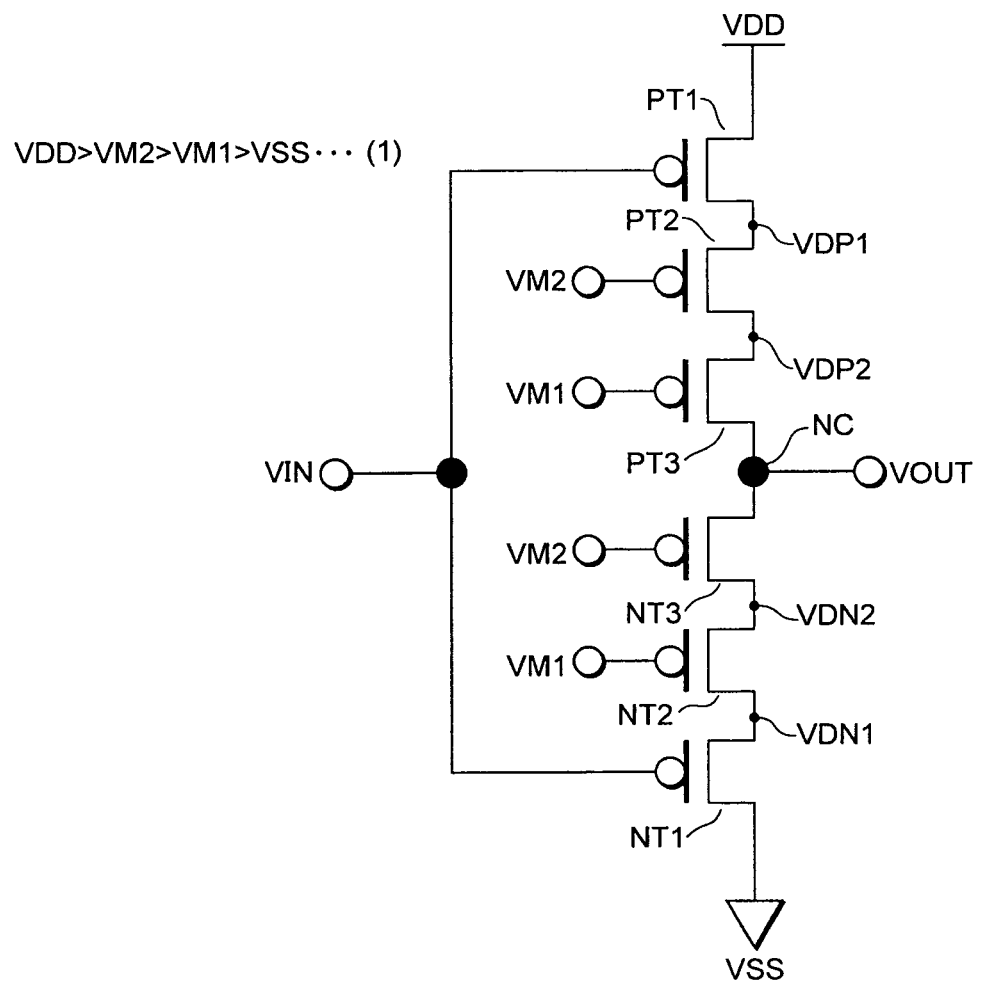
FIG. 1 is a circuit diagram showing the inverter circuit (semiconductor integrated circuit) of the first embodiment and a diagram showing the operation thereof.

Embodiments of the present invention are now explained in detail with reference to the attached drawings. The same reference numeral is given to components having the same function, and redundant explanation thereof is omitted.

First Embodiment

Figure 2:
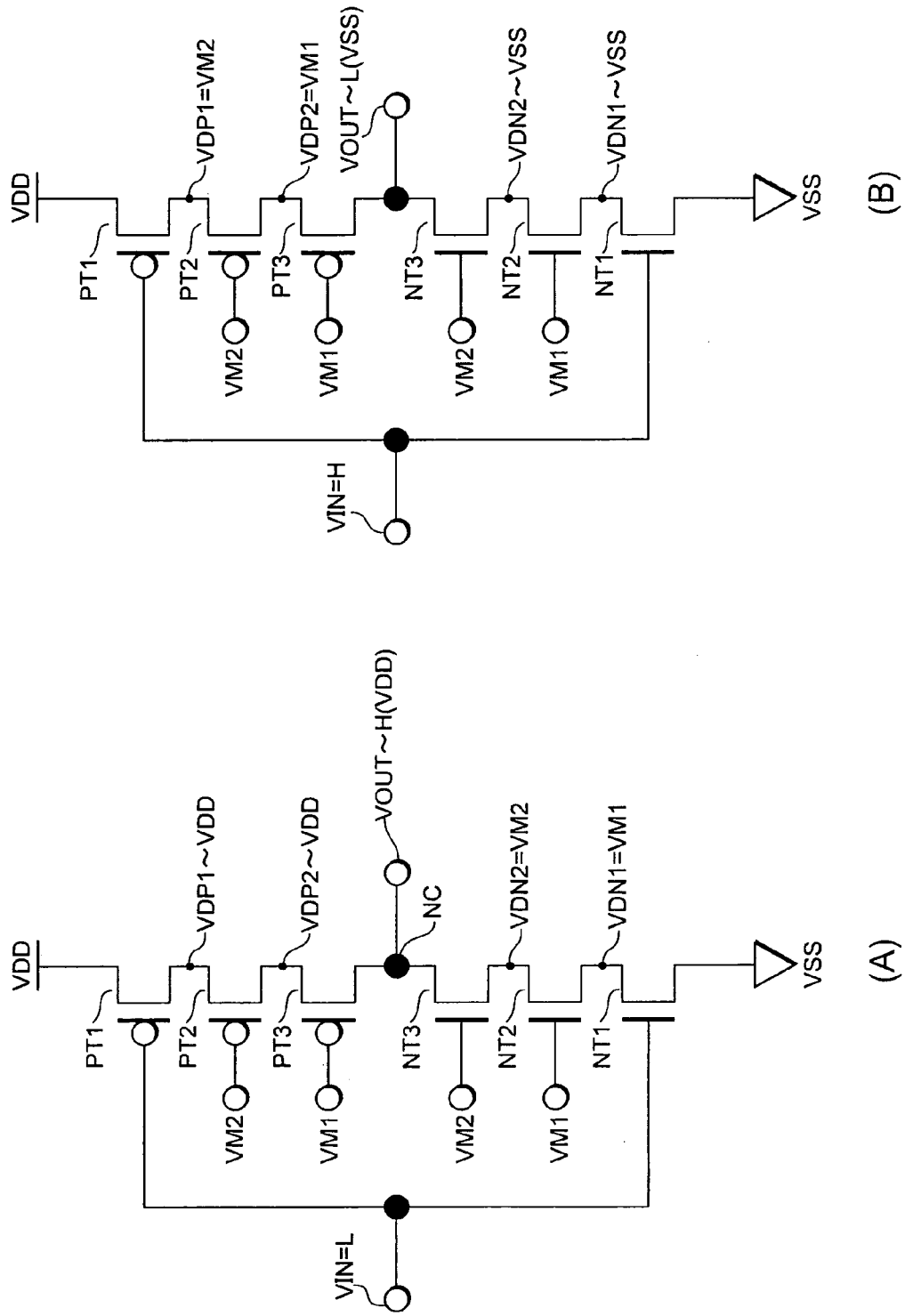
FIG. 2A and FIG. 2B are diagrams showing the operation of the inverter circuit (semiconductor integrated circuit) of the first embodiment.

FIG. 1 is a circuit diagram showing the inverter circuit (semiconductor integrated circuit) of this embodiment, and FIG. 2A and FIG. 2B are diagrams showing the operation thereof. The inverter circuit of this embodiment is configured from a plurality of thin film transistors (TFT). In the ensuing explanation, a thin film transistor is simply referred to as a "transistor." In this specification, a signal line, a node and their potential are given the same reference numeral.

A standard inverter circuit comprises a p-channel transistor (PT1) and an n-channel transistor (NT1) that are sequentially connected between a power source potential VDD and a grounding potential VSS, a gate terminal of these transistors is connected to an input signal line (input signal node) VIN, and a connection node NC of the p-channel transistor (PT1) and the n-channel transistor (NT1) is connected to an output signal line (output signal node) VOUT. In the ensuing explanation, these transistors (PT1, NT1) are sometimes referred to as a "drive transistor."

Nevertheless, this embodiment includes two p-channel transistors PT2, PT3 that are serially (cascade) connected between the p-channel transistor PT1 connected to a power source potential (power source potential node) VDD, and the connection node NC.

Among the above, a gate terminal of the p-channel transistor PT3 is connected to an intermediate range potential node VM1 that is positioned between the power source potential VDD and a grounding potential (grounding potential node) VSS. The intermediate range potential node VM1 may be a fixed potential, or configured to apply an intermediate range potential VM1 for driving the device as described later.

Meanwhile, a gate terminal of the p-channel transistor PT2 is connected to an intermediate range potential node VM2 which is an intermediate range potential positioned between the power source potential VDD and the grounding potential VSS and of a higher potential than the foregoing intermediate range potential VM1. The intermediate range potential node VM2 may also be a fixed potential, or configured to apply an intermediate range potential VM2 for driving the device as described later.

Specifically, the relationship of the respective potentials is as follows: power source potential VDD>intermediate range potential VM1>intermediate range potential VM2>grounding potential VSS . . . (1). So as long as the foregoing relational expression (1) is satisfied, there is no limitation on the spacing of these potentials, and the potential that is applied to the respective transistors can be divided approximately evenly by making the spacing approximately even, whereby the maximum applied voltage will decrease and the voltage resistance characteristics can be improved.

This embodiment also includes two n-channel transistors NT2, NT3 that are serially connected between the n-channel transistor NT1 connected to the grounding potential VSS, and the connection node NC.

Among the above, a gate terminal of the n-channel transistor NT2 is connected to the intermediate range potential node VM1 positioned between the power source potential VDD and the grounding potential VSS. The intermediate range potential node VM1 may be a fixed potential, or configured to apply an intermediate range potential VM1 for driving the device as described later.

Meanwhile, a gate terminal of the n-channel transistor NT3 is connected to the intermediate range potential node VM2 which is an intermediate range potential positioned between the power source potential VDD and the grounding potential VSS and of a higher potential than the foregoing intermediate range potential VM1. The intermediate range potential node VM2 may also be a fixed potential, or configured to apply an intermediate range potential VM2 for driving the device as described later.

Specifically, the relationship of the respective potentials is as follows: power source potential VDD>intermediate range potential VM1>intermediate range potential VM2>grounding potential VSS . . . (1). So as long as the foregoing relational expression (1) is satisfied, there is no limitation on the spacing of these potentials, and the potential that is applied to the respective transistors can be divided approximately evenly by making the spacing approximately even, whereby the maximum applied voltage will decrease and the voltage resistance characteristics can be improved. The intermediate range potential (VM1, VM2) that is applied to the p-channel transistors PT2, PT3 and the intermediate range potential (VM1, VM2) that is applied to the n-channel transistors NT2, NT3 may be different potentials. However, by using common potentials, the drawing of the intermediate range potential is facilitated, and the circuit design can be simplified. In the ensuing explanation, these transistors (PT2, PT3, NT2, NT3) are sometimes referred to as a "voltage-dividing transistor."

As shown in FIG. 2A, if an L level (low potential level, grounding potential VSS) potential is applied to the input signal line VIN, the p-channel transistor PT1 becomes an ON state (conductive state), and an H level (high potential level, power source potential VDD) signal is output from the output signal line VOUT via the p-channel transistors PT2, PT3. Here, the connection nodes VDP1, VDP2 of the p-channel transistors PT1 to PT3 will be approximately VDD (to VDD).

Meanwhile, although an H level potential is applied to both ends of cascade-connected n-channel transistors NT1 (OFF state), NT2 and NT3, since intermediate range potentials VM1, VM2 (provided that VM2>VM1) are respectively applied to the n-channel transistors NT2, NT3, the connection nodes VDN1, VDN2 of the n-channel transistors NT1 to NT3 will respectively be the same potential (VDN1=VM1, VDN2=VM2) as the applied intermediate range potential.

Thus, voltage that is applied to the respective n-channel transistors NT1, NT2 and NT3 can be divided, and the voltage resistance of the inverter circuit can be improved.

Contrarily, as shown in FIG. 2B, if an H level potential is applied to the input signal line VIN, the p-channel transistor PT1 becomes an ON state, and an L level signal is output from the output signal line VOUT via the n-channel transistors NT2, NT3. Here, the connection nodes VDN1, VDN2 of the n-channel transistors NT1 to NT3 will be approximately VSS (to VSS).

Meanwhile, although a VDD potential is applied to both ends of the cascade-connected p-channel transistors PT1, PT2 and PT3, since intermediate range potentials VM1, VM2 (provided that VM2>VM1) are respectively applied to the p-channel transistors PT3, PT2, the connection nodes VDP1, VDP2 of the p-channel transistors PT1 to PT3 will respectively be the same potential (VDP1=VM2, VDP2=VM1) as the applied intermediate range potential.

Accordingly, voltage that is applied to the respective p-channel transistors PT1, PT2 and PT3 can be divided, and the voltage resistance of the inverter circuit can be improved.

Although FIG. 1 showed a case of providing two p-channel transistors PT2, PT3 between the p-channel transistor PT1 and the connection node NC, and providing two n-channel transistors NT2, NT3 between the n-channel transistor NT1 and the connection node NC, the number of transistors to be provided may be one as shown below (refer to FIG. 3A, FIG. 3C and FIG. 3C), or three or more. As a result of increasing the number of transistors, voltage can be divided in multiple stages, and the voltage resistance that is demanded by one transistor can be designed to be lower.

FIG. 3A, FIG. 3C and FIG. 3C are respectively a circuit diagram showing another configuration of the inverter circuit of this embodiment, a cross section thereof, and a diagram showing the potential that is applied to the respective transistors.

In FIG. 3A, FIG. 3C and FIG. 3C, the p-channel transistor PT2 and the n-channel transistor NT3 in the circuit of FIG. 1 are omitted. Since the remainder of the configuration is the same as FIG. 1, the detailed explanation thereof is omitted.

In the foregoing case, if an L level potential is applied to the input signal line VIN, the p-channel transistor PT1 becomes an ON state, and an H level signal is output from the output signal line VOUT via the p-channel transistor PT3.

Here, if grounding potential VSS=L level=0V, power source potential VDD=H level=10V, and intermediate range potential VM1=5V, as shown in FIG. 3B, 0V is applied to a gate terminal of the n-channel transistor NT1, and the voltage (source voltage) of the source end thereof will be 0V. In addition, a 5V intermediate range potential VM1 is applied to a gate terminal of the n-channel transistor NT2, and the voltage (drain voltage) of the drain end thereof will be 10V. Here, the potentials of the source region, the channel region, and the drain region of the respective transistors NT1, NT2, as shown in FIG. 3C, rise in a staircase pattern sequentially from the source region of the transistor NT1. In FIG. 3C, the vertical axis represents the potential (potential [V]), and the horizontal axis represents the distance x[(m] from the source region of the transistor NT1 in the cross section of the transistors NT1 and NT2.

In FIG. 3B, G is a gate electrode, and is disposed on the semiconductor layer (channel layer) via a gate insulating film not shown. N++ on both ends of the gate electrode G shows the source or drain region, and N+ shows the LDD region. As described above, with a thin film transistor, it is necessary to increase the impurity concentration to approximately several times that of the residual defect density of the layer that is used as the semiconductor layer (channel layer). For example, in the case of low-temperature polysilicon, since it is necessary to increase the impurity concentration to a residual defect density of 1017/cm2 or higher, it is indicated as "N+." In the simulation of FIG. 3C, the gate length (L) was set to 4(m, and the gate width (W) was set to 1(m.

As described above, with the circuit of FIG. 3A, FIG. 3C and FIG. 3C, it is evident that a potential of only roughly ½ of VOUT is applied to the respective transistors (NT1, NT2); in particular, to the drain end. To put it differently, voltage is divided by the transistor (NT2) in which the gate terminal is connected to the intermediate range potential, and the voltage that is applied to the respective transistors can be reduced. In particular, with a thin film transistor having a simulated SOI structure in which the source and drain region extends to the lower part of the semiconductor layer, since it is not necessary to give consideration to the voltage resistance between the source and drain region and the semiconductor layer (well in terms of a bulk transistor), the reduction of potential that is applied to the foregoing drain end will contribute considerably to the improvement in characteristics of the thin film transistor, and the circuit configuration and circuit operation of this embodiment are suitable for use in a thin film transistor.

Even in cases where an H level potential is applied to the input signal line VIN and an L level signal is output from the output signal line VOUT in the circuit of FIG. 3A, it is easy to analogize that voltage will be divided in a reverse staircase pattern. Moreover, as shown in FIG. 2A and FIG. 2B, even in cases where voltage is divided in multiple stages with a plurality of voltage-dividing transistors, voltage is divided according to the number of transistors, and it is easy to analogize that voltage will be divided in a staircase pattern of "number of voltage-dividing transistors+1."

Meanwhile, in the case of a single gate transistor or the circuit of the comparative example shown in FIG. 5, a high potential is applied as shown below.

Figure 4:
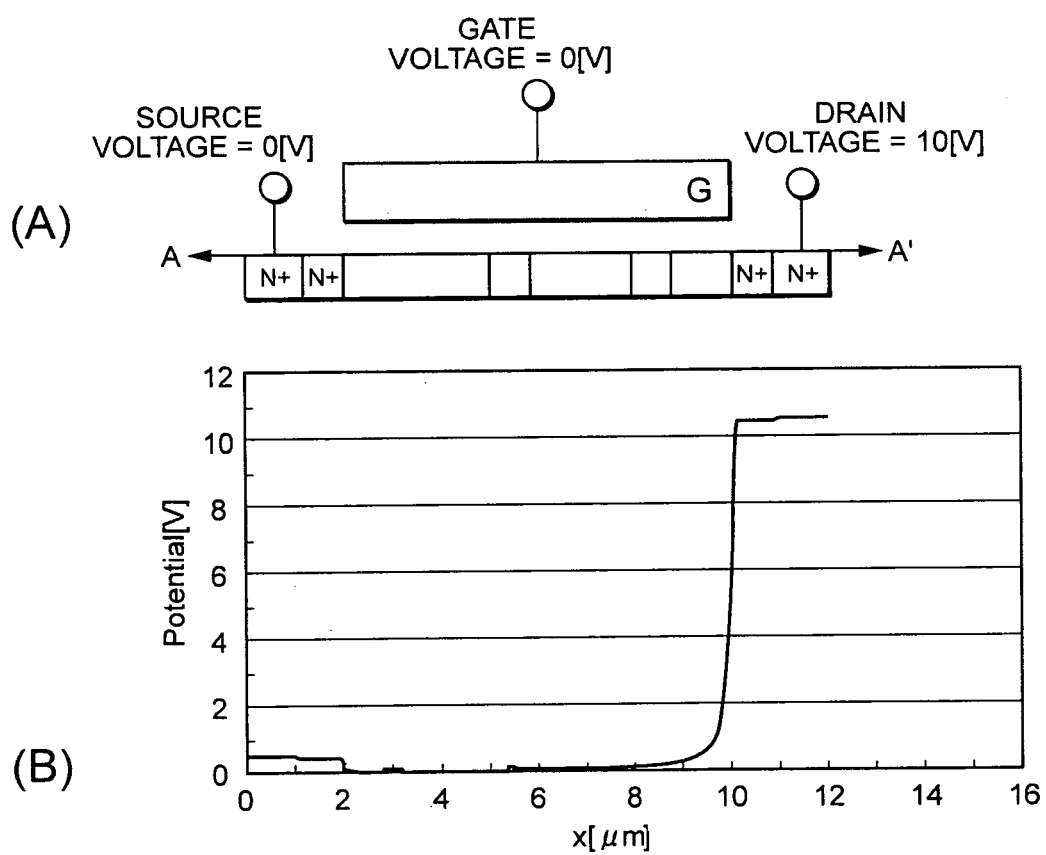
FIG. 4A and FIG. 4B are diagrams showing the potential that is applied to a single gate transistor.

FIG. 4A and FIG. 4B are diagrams showing the potential that is applied to a single gate transistor, FIG. 5 is a circuit diagram showing the circuit configuration of the comparative example, and FIG. 6A and FIG. 6B are respectively a cross section of the circuit of the comparative example and a diagram showing the potential that is applied to the respective transistors.

As shown in FIG. 4A, in cases where a potential of L level=0V is applied to a source terminal of a single gate n-channel transistor, and a potential of power source potential VDD=H level=10V is applied to a drain terminal, even if the potential that is applied to the gate terminal is L level=0V, a potential of approximately 10V is applied to the drain region.

Moreover, as shown in FIG. 5, with the comparative example in which the gate terminals of the p-channel transistor PT3 and the n-channel transistor NT2 are connected to an input signal line VIN, if a potential of L level=0V is applied to the input signal line VIN, 0V is applied to the gate terminal of the n-channel transistor NT1, and the voltage (drain voltage) of the drain end of the n-channel transistor NT2 becomes 10V (VOUT) (FIG. 6A).

In the foregoing case, the potentials of the source region, the channel region, and the drain region of the respective transistors NT1, NT2 are, as shown in FIG. 6B, approximately 0V from the source region side of the transistor NT1 to the channel region of the transistor NT2, and a high potential of approximately 10V is applied to the drain region of the transistor NT2. As described above, in cases where the gate terminals of the p-channel transistor PT3 and the n-channel transistor NT2 are connected to the input signal line VIN, no voltage-dividing effect is yielded, a high voltage is applied, and high voltage resistance cannot be achieved. Meanwhile, this embodiment is able to effectively yield the effect of dividing the voltage as described above.

The effect of the foregoing voltage-dividing is yielded regardless of the size of the potential that is applied to the input signal line VIN.

Figure 7:
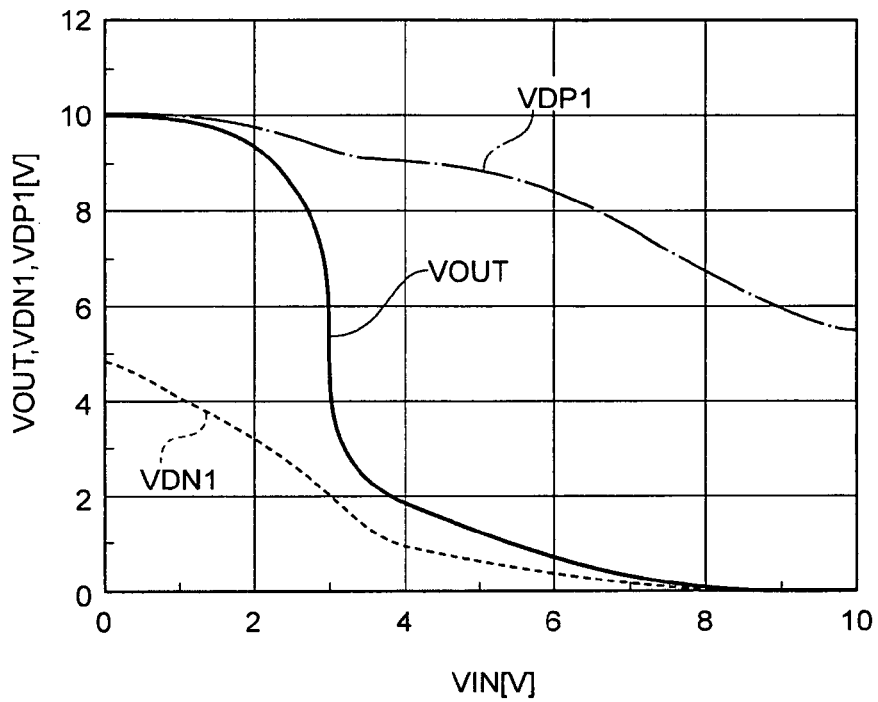
FIG. 7 is a diagram showing the potential of the respective nodes (VOUT, VDN1, VDP1) in relation to the potential that is applied to the input signal line VIN of the inverter circuit shown in FIG. 3A, FIG. 3C and FIG. 3C.

FIG. 7 is a diagram showing a potential change of the respective nodes (VOUT, VDN1, VDP1) in the potential that is applied to the input signal line VIN of the inverter circuit shown in FIG. 3A, FIG. 3C and FIG. 3C. The horizontal axis shows the potential [V] that is applied to the input signal line VIN, and vertical axis shows the potential [V] of the respective nodes (VOUT, VDP1, VDN1). Incidentally, the gate length of the transistor that is used in the observation of FIG. 7 and FIG. 8 described later was 10 μm, and the gate width thereof was 20 μm.

In FIG. 7, if VIN=0V, a potential of VOUT=10V is output as described above. Here, it can be understood that VDN1 will be divided to approximately 5V from FIG. 7. The potential of VDP1 will be 10V which is approximately the same as VOUT.

Here, even if VIN rises to 2V, VDN1 will be approximately 3V, and the voltage-dividing effect can be confirmed. In the foregoing case, the potentials of VDP1 and VOUT will decrease lightly.

Meanwhile, if VIN=10V, a potential of VOUT=0V is output as described above. Here, it can be understood that VDP1 will be divided to approximately 5V from FIG. 7. The potential of VDN1 will be 0V which is approximately the same as VOUT.

Here, even if VIN falls to 8V, VDN1 will be approximately 7V, and the voltage-dividing effect can be confirmed. The potentials of VDP1 and VOUT are still approximately 0V at this time.

Accordingly, the voltage-dividing effect can be confirmed even if VIN changes.

Figure 8:
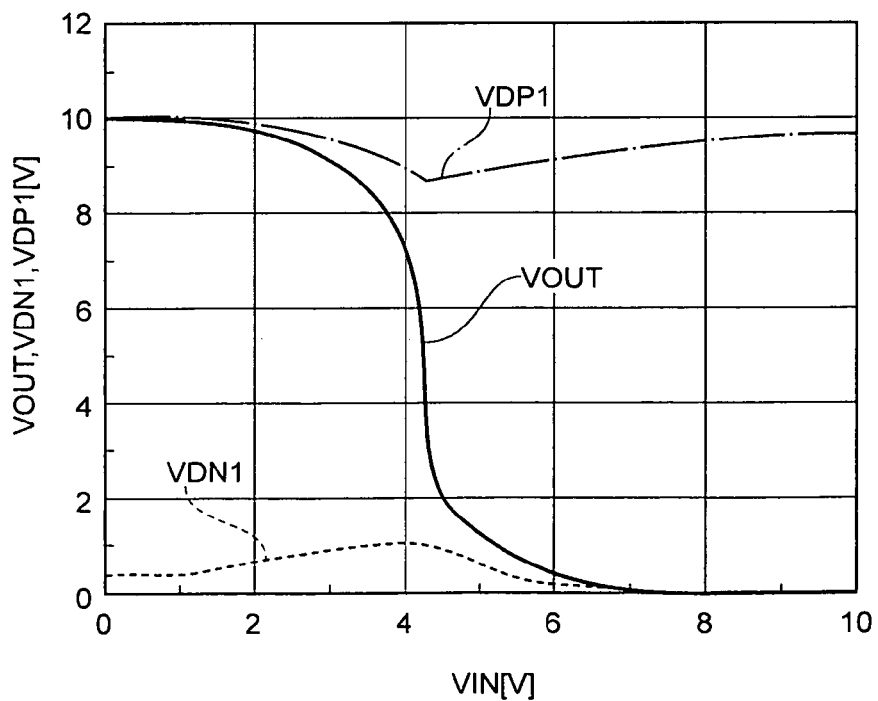
FIG. 8 is a diagram showing the potential change of the respective nodes (VOUT, VDN1, VDP1) in relation to the potential that is applied to the input signal line VIN of the inverter circuit shown in FIG. 5.

Meanwhile, the case of the comparative example shown in FIG. 5 is explained below. FIG. 8 is a diagram showing the potential change of the respective nodes (VOUT, VDN1, VDP1) in relation to the potential that is applied to the input signal line VIN of the inverter circuit shown in FIG. 5. As shown in FIG. 8, it was confirmed that VDN1 is only displaced within the range of approximately 0 to 1V in relation to any VIN, and VDP1 is also only displaced within the range of approximately 10V to 8.5V, and it is evident that hardly any voltage-dividing effect is yielded.

Meanwhile, this embodiment is able to yield a voltage-dividing effect even if the potential that is applied to the input signal line VIN changes as described above.

Second Embodiment

Although a voltage-dividing transistor was used in the inverter circuit in the first embodiment, an example of a level shifter circuit is explained in this embodiment.

Figure 9:
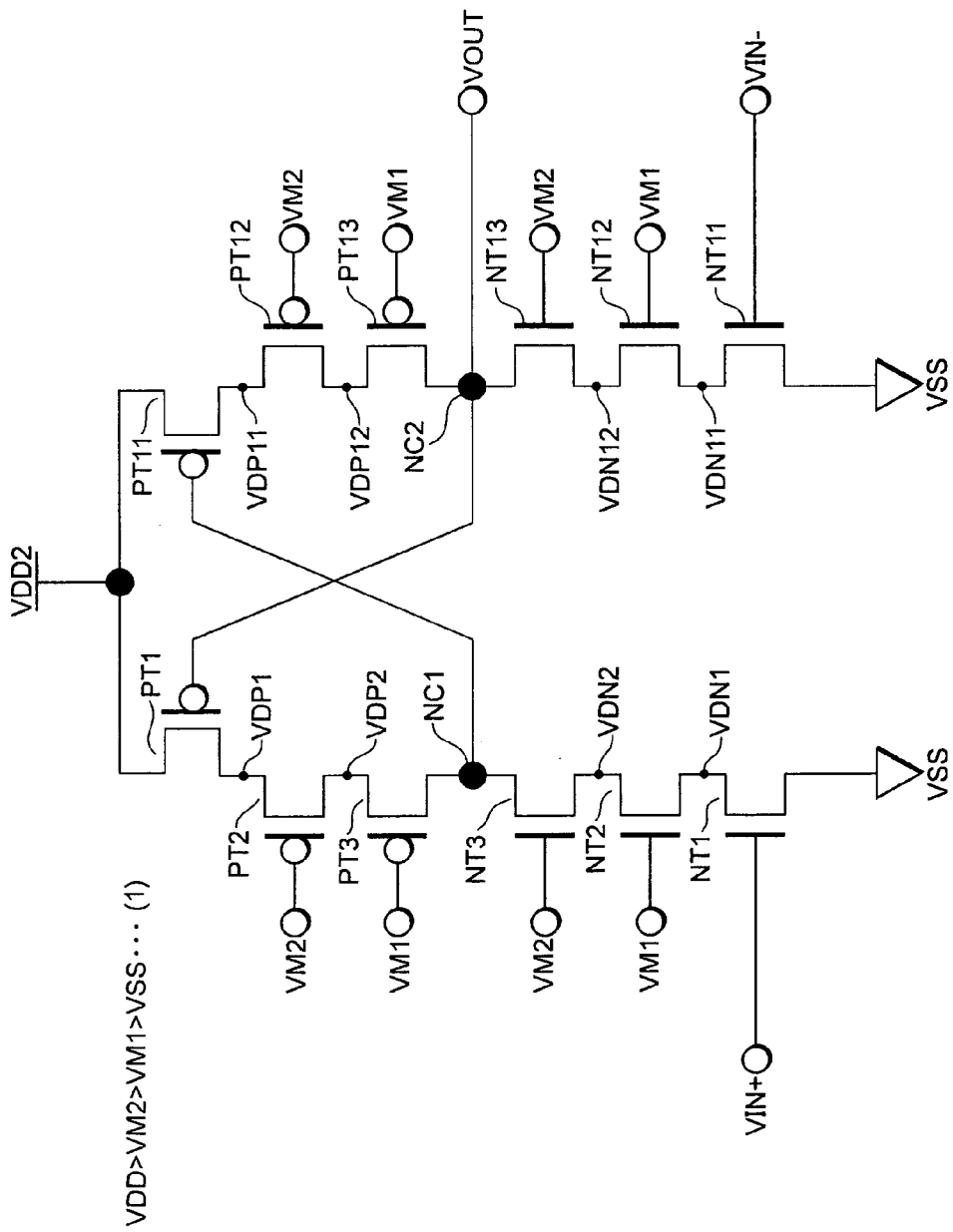
FIG. 9 is a circuit diagram showing the level shifter circuit (semiconductor integrated circuit) of the second embodiment.
Figure 11:
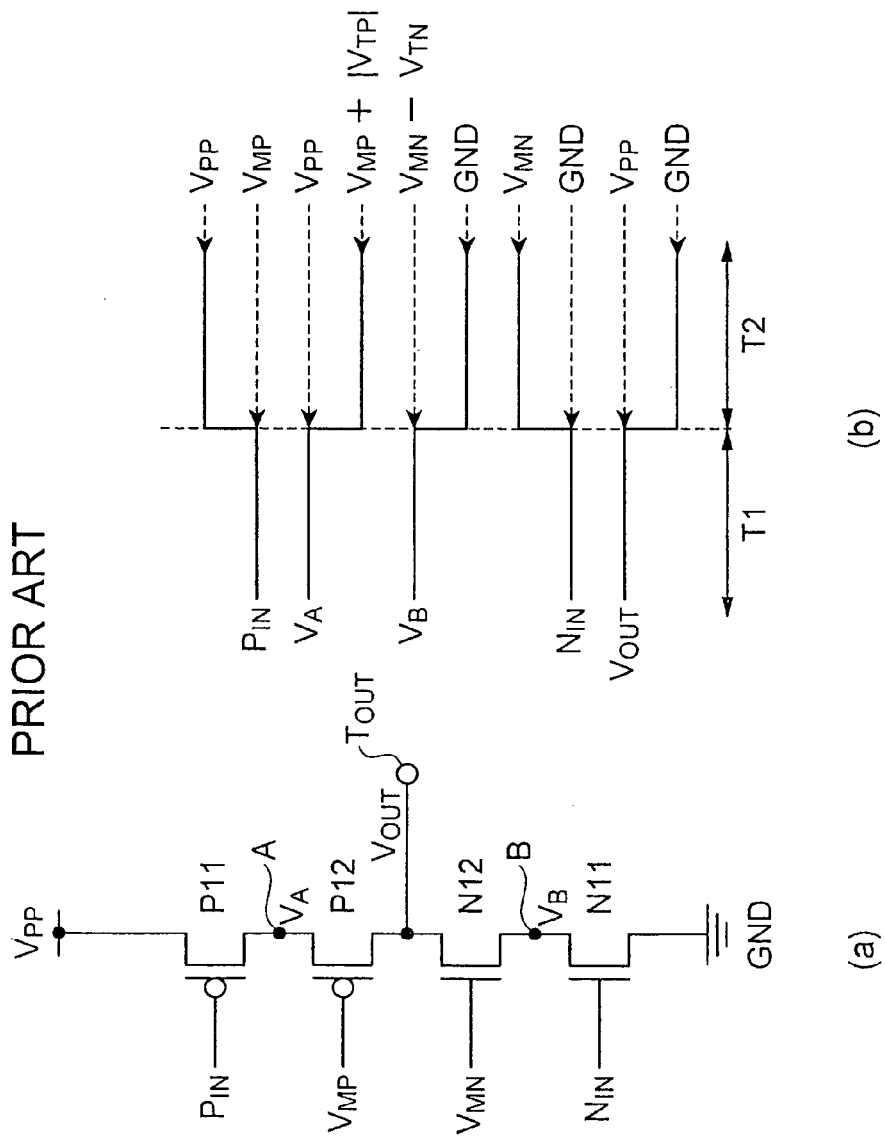
FIG. 11A and FIG. 11B are diagrams showing an embodiment of Japanese Patent Application Laid-open No. 2001-102915.

FIG. 9 is a circuit diagram showing the level shifter circuit (semiconductor integrated circuit) of this embodiment, and FIG. 10A and FIG. 10B are diagrams showing the operation of the level shifter circuit of this embodiment.

A standard level shifter circuit comprises pairs of a p-channel transistor and an n-channel transistor (pairs of PT1 and NT1 and PT11 and NT11) that are connected in parallel between the second power source potential (high power source potential) VDD2 and the grounding potential VSS, and these connection nodes (NC1, NC2) are cross-connected to the p-channel transistors (PT1, PT11). The gate terminals of the n-channel transistors (NT1, NT11) are respectively connected to the input signal lines (input signal node) VIN+, VIN− to which a complemented signal is input. In addition, the foregoing connection node NC2 is connected to the output signal line (output signal node) VOUT.

Nevertheless, this embodiment includes two p-channel transistors PT2, PT3 that are serially connected between the p-channel transistor PT1 connected to a second power source potential (second power source potential node) VDD, and the connection node NC1.

This embodiment additionally includes two p-channel transistors PT12, PT13 that are cascade-connected between the p-channel transistor PT11 connected to the power source potential VDD, and the connection node NC2.

This embodiment additionally includes two n-channel transistors NT2, NT3 that are cascade-connected between the n-channel transistor NT1 connected to the grounding potential VSS, and the connection node NC1.

This embodiment additionally includes two n-channel transistors NT12, PT13 that are cascade-connected between the n-channel transistor NT11 connected to the grounding potential VSS, and the connection node NC1.

Among the above, the gate terminals of the p-channel transistors PT3 and PT13 are connected to the intermediate range potential node VM1 positioned between the power source potential VDD and the grounding potential VSS. The intermediate range potential node VM1 may be a fixed potential, or configured to apply an intermediate range potential VM1 for driving the device as described later.

Moreover, the gate terminals of the p-channel transistors PT2 and PT12 are connected to the intermediate range potential node VM2 which is an intermediate range potential positioned between the power source potential VDD and the grounding potential VSS, and of a higher potential than the foregoing intermediate range potential VM1. The intermediate range potential node VM2 may also be a fixed potential, or configured to apply an intermediate range potential VM2 for driving the device as described later.

The gate terminals of the n-channel transistors NT2 and NT12 are connected to the intermediate range potential node VM1 positioned between the power source potential VDD and the grounding potential VSS.

The gate terminals of the n-channel transistors NT3 and NT13 are connected to the intermediate range potential node VM2 which is an intermediate range potential positioned between the power source potential VDD and the grounding potential VSS, and of a higher potential than the foregoing intermediate range potential VM1.

Specifically, the relationship of the respective potentials is as follows: power source potential VDD>intermediate range potential VM1>intermediate range potential VM2>grounding potential VSS . . . (1). So as long as the foregoing relational expression (1) is satisfied, there is no limitation on the spacing of these potentials, and the potential that is applied to the respective transistors can be divided approximately evenly by making the spacing approximately even, whereby the maximum applied voltage will decrease and the voltage resistance characteristics can be improved. The intermediate range potentials (VM1, VM2) that are applied to the p-channel transistors PT2, PT3, PT12, PT13 and the intermediate range potentials (VM1, VM2) that are applied to the n-channel transistors NT2, NT3, NT12, NT13 may be different potentials. However, by using common potentials, the drawing of the intermediate range potential is facilitated, and the circuit design can be simplified.

The circuit operation of the level shifter circuit is now explained.

(1) First Operation

As shown in FIG. 10A, when an H level potential is applied to the input signal line VIN+ and an L level potential is applied to VIN−, the n-channel transistor NT1 becomes an ON state, and the connection node NC1 becomes an L level via the n-channel transistors NT2, NT3. Here, since the connection node NC1 is an L level, the p-channel transistor PT11 becomes an ON state, and a signal of a second power source potential level (high power source potential level) is output from the output signal line VOUT via the p-channel transistors PT12, PT13. Here, approximately 5V of H level (first power source potential level) is applied to VIN+, and the second power source potential VDD2 is, for instance, 15V.

(2) Second Operation

Meanwhile, as shown in FIG. 10B, when an L level potential is applied to the input signal line VIN+ and H level potential is applied to VIN−, the p-channel transistor PT11 becomes an ON state, and an L level signal is output from the output signal line VOUT via the p-channel transistors PT12, PT13. Here, since the connection node NC2 (output signal line VOUT) is an L level, the p-channel transistor PT1 becomes an ON state, and the connection node NC1 becomes a second power source potential VDD2 level via the p-channel transistors PT2, PT3.

Based on the foregoing operation, the potentials of 5V to 0V of VIN+ to VIN− can be level-shifted to the potentials of 15V to 0V of VOUT.

In the foregoing first operation, although a potential of VDD2=15V is applied to both ends of the p-channel transistors PT1, PT2 and PT3, since intermediate range potentials VM1, VM2 (provided that VM2>VM1) are applied respectively to the p-channel transistors PT3, PT2, the connection nodes VDP1, VDP2 of the p-channel transistors PT1 to PT3 will respectively be the same potential (VDP1=VM2, VDP2=VM1) as the applied intermediate range potential. In addition, although a potential of VDD2=15 is applied to both ends of the n-channel transistors NT11, NT12 and NT13, since the intermediate range potentials VM1, VM2 (provided that VM2>VM1) are respectively applied to the n-channel transistors NT13, NT12, the connection nodes VDN11, VDN12 of the n-channel transistors NT11 to NT13 will respectively be the same potential (VDN11=VM1, VDN12=VM2) as the applied intermediate range potential.

Accordingly, voltage that is applied to the respective transistors PT1 to PT3, NT11 to NT13 can be divided, and the voltage resistance of the level shifter circuit can be improved.

In the second operation also, although a potential of VDD2=15V is applied to both ends of the p-channel transistors PT11, PT12 and PT13, since the intermediate range potentials VM1, VM2 (provided that VM2>VM1) are respectively applied to the p-channel transistors PT13, PT12, the connection nodes VDP1, VDP2 of the p-channel transistors PT11 to PT13 will respective be the same potential (VDP11=VM2, VDP12=VM1) as the applied intermediate range potential. Although a potential of VDD2=15V is also applied to both ends of the n-channel transistors NT1, NT2 and NT3, since the intermediate range potentials VM2, VM1 (provided that VM2>VM1) are respectively applied to the n-channel transistors NT3, NT2, the connection nodes VDN1, VDN2 of the n-channel transistors NT1 to NT3 will respectively be the same potential (VDN1=VM1, VDN2=VM2) as the applied intermediate range potential.

Accordingly, the voltage that is applied to the respective transistors PT11 to PT13, NT1 to NT3 can be divided, and the voltage resistance of the level shifter circuit can be improved.

Although FIG. 9 showed a case of providing two p-channel voltage-dividing transistors between the p-channel drive transistors PT1, PT11 and the respective connection nodes NC1, NC2, and providing two n-channel voltage-dividing transistors between the n-channel drive transistor NT1, NT11 and the connection nodes NC1, NC2, the number of transistors to be provided may be one or three or more. In the case of providing one transistor, the p-channel transistors PT2, PT12 and the n-channel transistors NT3, NT13 in the circuit of FIG. 9 may be omitted.

Third Embodiment

Figure 12:
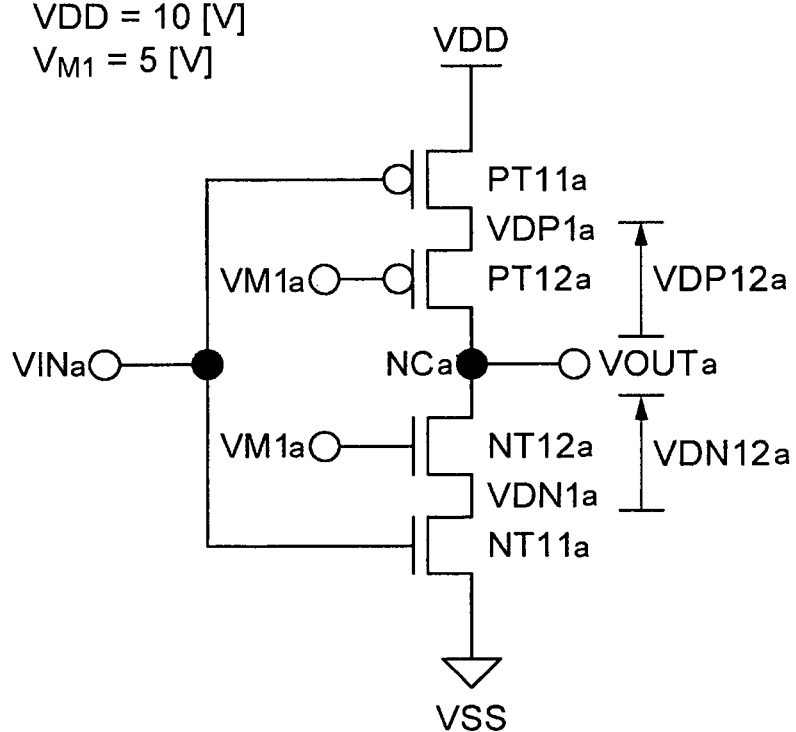
FIG. 12 is a circuit diagram showing the circuit configuration of the comparative example.

Here, in the circuit diagram shown in FIG. 12, there are cases where the output voltage is not divided evenly and excessive voltage stress is applied to each P-channel transistor or N-channel transistor connected to the output voltage Vout if the input voltage is an intermediate level or the circuit is operated in a state where a high load is connected to the output side. This voltage stress induces deterioration in the performance of transistors, and diminishes the long-term reliability of the overall circuit.

As a comparative example explaining the foregoing problems, the following observation result is explained. After foremost explaining the circuit configuration, the basic I/O characteristics and the load characteristics will be explained subsequently.

(1) Circuit Configuration

FIG. 12 is a circuit diagram showing the circuit configuration of the comparative example used in the observation. In FIG. 12, an inverter circuit is configured from two p-channel transistors PT11a and PT12a and two n-channel transistors NT11a and NT12a that are sequentially connected between the power source potential VDD and the grounding potential VSS. The input signal line VINa is connected to a gate terminal of the p-channel transistor PT11a and a gate terminal of the n-channel transistor NT11a, respectively. An intermediate range potential VM1a positioned between the power source potential VDD and the grounding potential VSS is applied to the gate terminal of the p-channel transistor PT12a and the gate terminal of the n-channel transistor NT12a, respectively, and the connection node NCa between the foregoing transistors is connected to an output signal line VOUTa. The gate length L of the respective transistors is 10[μm], the gate width W is 20[V], the grounding potential VSS is 0[V], the power source potential VDD is 20[V], and the intermediate range potential VM1 is 10[V].

(2) Basic I/O Characteristics

Figure 13:
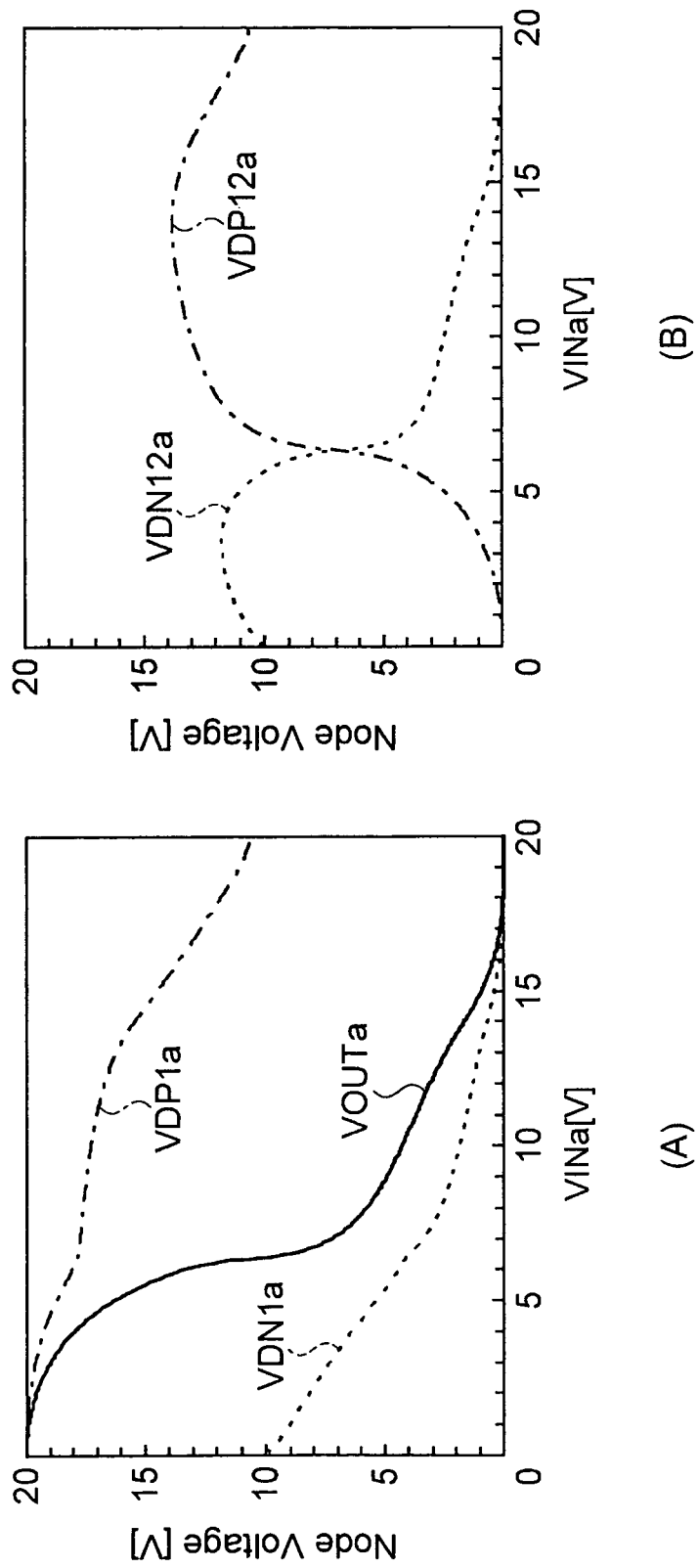
FIG. 13A and FIG. 13B are diagrams showing the I/O characteristics of the comparative example.

The observation result of the I/O characteristics of the circuit of FIG. 12 is shown in FIG. 13A. According to FIG. 13A, in a state where an L level (grounding potential VSS) potential is applied to the input signal line VIN, the voltage that is applied between the source-drain of the n-channel transistors NT11a and NT12a is divided with the intermediate range potential VM1a. However, if the applied voltage to the input signal line VINa is increased, the n-channel transistor NT11a shifts from the OFF state to the ON state, and the potential of the connection node VDN1a of the foregoing transistor and the n-channel transistor NT12a will drop. Since the potential of the output signal line VOUTa will reduce with a slight delay in relation to the drop of the foregoing potential, voltage that is applied between the source-drain of the n-channel transistor NT12a will once increase, then decrease.

Meanwhile, if the applied voltage to the input signal line VINa decreases from the H level (power source potential VDD), the p-channel transistor PT11a shifts from the OFF state to the ON state, and the potential of the connection node VDP1a of the foregoing transistor and the p-channel transistor PT12a will rise. Since the potential of the output signal line VOUTa will rise with a slight delay in relation to the rise of the foregoing potential, voltage that is applied between the source-drain of the p-channel transistor PT12a will once increase more than the level of the intermediate range potential VM1a, and then decrease.

FIG. 3B shows the voltages VDN12a and VDP12a that are applied between the source-drain of the n-channel transistor NT12a and the p-channel transistor PT12a in relation to the applied voltage to the input signal line VINa. According to FIG. 3B, it is possible to understand that the voltage VDN12a reaches approximately 12[V] at maximum, and that VDP12a reaches approximately 14[V] at maximum.

(3) Load Characteristics

Figure 14:
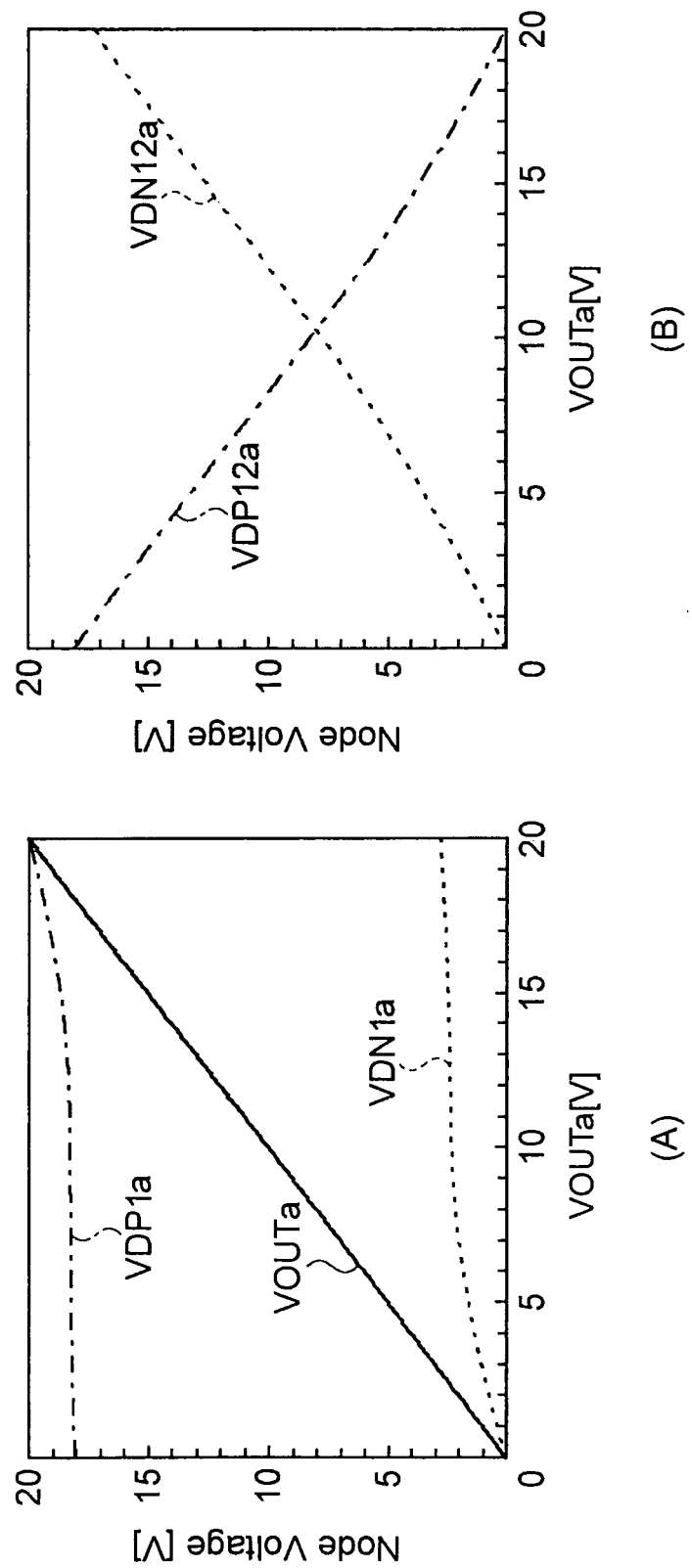
FIG. 14A and FIG. 14B are diagrams showing the output load characteristics of the comparative example.

FIG. 14A shows the change of the connection node VDN1a of the n-channel transistors NT11a and NT12a when an H level is input to the input signal line VINa and voltage of VSS to VDD is applied to the output signal line VOUTa, and the change of the connection node VDP1a of the p-channel transistors PT11a and PT12a when an L level is input to the signal line VINa and voltage of VDD to VSS is applied to the output signal line VOUTa. As described above, a state where a high load is connected to the output side can be simulated by forcibly changing the voltage in the output signal line VOUT.

According to FIG. 14A, even if the load that is applied to the output signal line VOUTa increases, the connection nodes VDN1a and VDP1a hardly change, and consequently the division of voltage that is applied between the source-drain of the n-channel transistor NT12a and p-channel transistor PT12a mainly increases. FIG. 14B shows the change of the voltages VDN12a and VDP12a that are applied between the source-drain of the n-channel transistor NT12a and the p-channel transistor PT12a under the operation conditions of FIG. 14A. According to FIG. 14B, it is possible to understand that the voltage VDN12a reaches approximately 17[V] at maximum, and that VDP12a reaches approximately 18[V] at maximum.

An example of excessive voltage stress that is applied to a specific transistor in a high voltage drive circuit was explained above. This voltage stress is transient voltage stress that occurs when the I/O signal is switched, and cannot be ignored if the circuit is to be operated for a long period of time since it consequently induces deterioration in the performance of the foregoing transistor, and diminishes the long-term reliability of the overall circuit.

Thus, a further improved circuit is now explained in the ensuing embodiment.

The third embodiment shows the application to the inverter circuit. After foremost explaining the circuit configuration, the basic I/O characteristics and the load characteristics will be explained subsequently.

(1) Circuit Configuration

Figure 15:
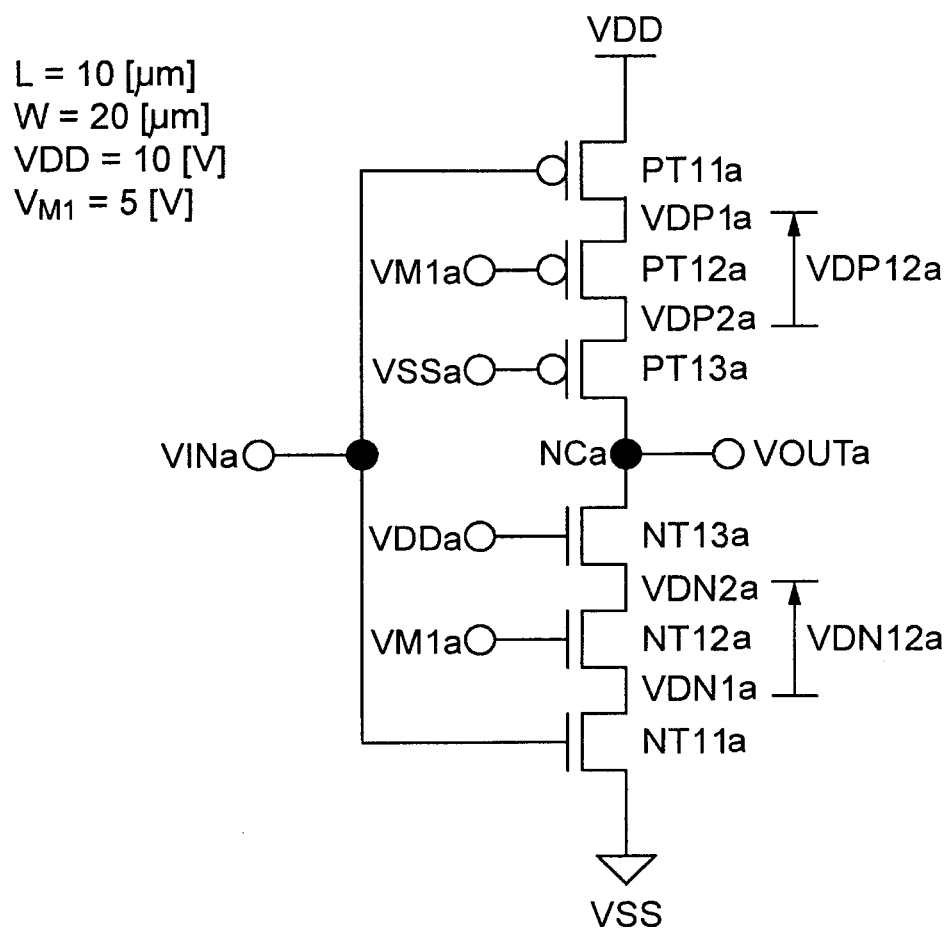
FIG. 15 is a circuit diagram showing the inverter circuit (semiconductor integrated circuit) of the third embodiment.

FIG. 15 is a circuit diagram showing the inverter circuit (semiconductor integrated circuit) of this embodiment, and the inverter circuit of this embodiment is configured from a plurality of thin film transistors (TFT). In the ensuing explanation, a thin film transistor is simply referred to as a "transistor." In this specification, a signal line, a node and their potential are given the same reference numeral.

A standard inverter circuit comprises a p-channel transistor PT11a and an n-channel transistor NT11a that are sequentially connected between a power source potential VDD and a grounding potential VSS, a gate terminal of these transistors is connected to an input signal line (input signal node) VINa, and a connection node NCa of the p-channel transistor PT11a and the n-channel transistor NT11a is connected to an output signal line (output signal node) VOUTa. In the ensuing explanation, these transistors PT11a and NT11a are sometimes referred to as a "drive transistor."

Nevertheless, this embodiment includes two p-channel transistors PT12a and PT13a serially connected (cascade-connected) between the p-channel transistor PT11a connected to the power source potential VDD, and the connection node NCa. Among the above, the gate terminal of the p-channel transistor PT13a is connected to the grounding potential VSS.

Meanwhile, the gate terminal of the p-channel transistor PT12a is connected to an intermediate range potential VM1a positioned between the power source potential VDD and the grounding potential VSS. The intermediate range potential VM1a may be a fixed potential, or configured to apply an intermediate range potential VM1a for driving the device as described later. Specifically, the relationship of the respective potentials will be the following relational expression (1):

$$\text{power source potential } VDD > \text{intermediate range potential } VM1a > \text{grounding potential } VSS \qquad (1)$$

So as long as the foregoing relational expression (1) is satisfied, there is no limitation on the spacing of these potentials, but it is preferable to make the potential difference between the intermediate range potential VM1a and the grounding potential VSS ½ the potential difference between the power source potential VDD and the grounding potential VSS. Consequently, the potential that is applied between the source/drain of the p-channel transistors PT11a and PT12a can be divided approximately evenly, whereby the voltage resistance characteristics can be improved.

This embodiment includes two n-channel transistors NT12a and NT13a that are serially connected between the n-channel transistor NT11a connected to the grounding potential VSS, and the connection node NCa.

Among the above, the gate terminal of the n-channel transistor NT12a is connected to the intermediate range potential VM1a positioned between the power source potential VDD and the grounding potential VSS. The intermediate range potential VM1a may be a fixed potential, or configured to apply an intermediate range potential VM1a for driving the device as described later.

Meanwhile, the gate terminal of the n-channel transistor NT13a is connected to the power source potential VDD. Specifically, the relationship of the respective potentials will be the foregoing relational expression (1). So as long as the foregoing relational expression (1) is satisfied, there is no limitation on the spacing of these potentials, but it is preferable to make the potential difference between the intermediate range potential VM1a and the grounding potential VSS the potential difference between the power source potential VDD and the grounding potential VSS. Consequently, the potential that is applied between the source/drain of the n-channel transistors NT11a and NT12a can be divided approximately evenly. The intermediate range potential that is applied to the p-channel transistor PT12a and the intermediate range potential that is applied to the n-channel transistor NT12a may be different potentials. However, by using common potentials, the drawing of the intermediate range potential is facilitated, and the circuit design can be simplified. In the ensuing explanation, the p-channel transistor PT12a and the n-channel transistor NT12a are sometimes referred to as a "voltage-dividing transistor," and the p-channel transistor PT13a and the n-channel transistor NT13a are sometimes referred to as an "auxiliary voltage-dividing transistor."

(2) Basic I/O Characteristics

Figure 16:
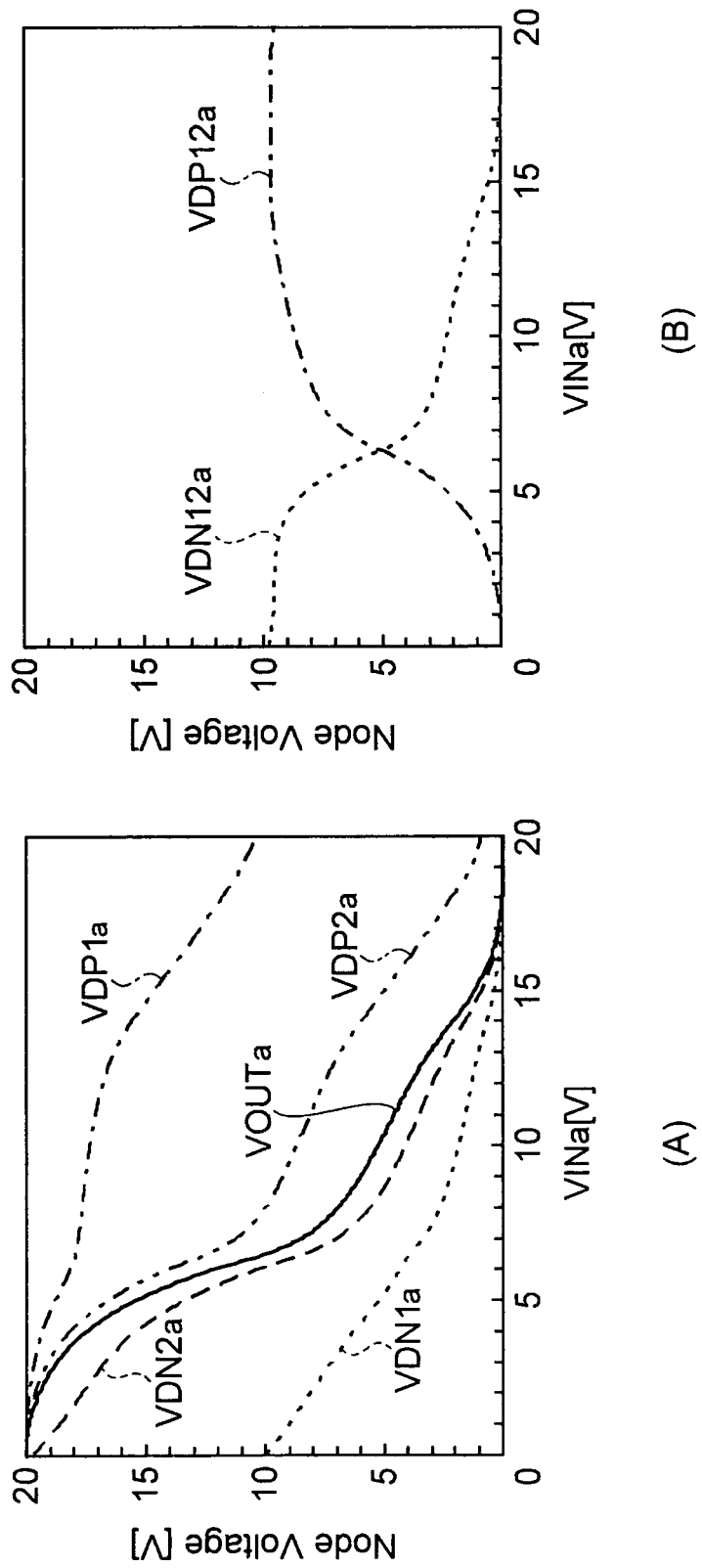
FIG. 16A and FIG. 16B are diagrams showing the I/O characteristics of the inverter circuit of the third embodiment.

The observation result of the I/O characteristics of the circuit of FIG. 15 is shown in FIG. 16A. The gate length L of the respective transistors is 10[μm], the gate width W is 20[μm], the grounding potential VSS is 0[V], the power source potential VDD is 20[V], and the intermediate range potential VM1 is 10[V].

In FIG. 16A, if an L level (low potential level; that is, grounding potential VSS=0[V]) potential is applied to the input signal line VINa, the p-channel transistors PT11a, PT12a and PT13a become an ON state (conductive state), and an H level (high potential level; that is, power source potential VDD=20[V]) signal is output from the output signal line VOUTa. Here, the connection nodes VDP1a and VDP2a of the p-channel transistors PT11a, PT12a and PT13a will be approximately the power source potential VDD.

Meanwhile, the n-channel transistor NT11a becomes an OFF state, and when the potential of the connection node VDN1a of the foregoing transistor NT11a and the n-channel transistor NT12a rises to approximately the intermediate range potential VM1a, the n-channel transistor NT12a comes an OFF state. Consequently, the potential of the connection node VDN2a of the n-channel transistor NT12a and the n-channel transistor NT13a will rise to approximately the power source potential VDD, and the n-channel transistor NT13a becomes an OFF state.

Accordingly, voltage that is applied between the source-drain of the respective n-channel transistors NT11a, NT12a and NT13a can be divided, and the voltage resistance of the inverter circuit can be improved.

Contrarily, if an H level potential is applied to the input signal line VIN, the n-channel transistor NT11a becomes an ON state, and an L level signal is output from the output signal line VOUTa via the n-channel transistors NT12a, NT13a. Here, the connection nodes VDN1a and VDN2a of the n-channel transistors NT11a, NT12a and NT13a becomes approximately the grounding potential VSS.

Meanwhile, the p-channel transistor PT11a becomes an OFF state, and the n-channel transistor NT12a becomes an OFF state when the potential of the connection node VDP1a of the p-channel transistor PT11a and the p-channel transistor PT12a drops to approximately the intermediate range potential VM1a. Consequently, the potential of the connection node VDN2a of the n-channel transistor NT12a and the n-channel transistor NT13a drops to approximately the power source potential VDD, and the n-channel transistor NT13a becomes an OFF state.

Accordingly, voltage that is applied between the source-drain of the respective p-channel transistors PT1a, PT2a and PT3a can be divided, and the voltage resistance of the inverter circuit can be improved.

If the applied voltage to the input signal line VINa increases from the L level, the n-channel transistor NT11a shifts to an ON state, and the potential of the connection node VDN1a of the foregoing transistor and the n-channel transistor NT12a will drop. Since the potential of the output signal line VOUTa will drop with a slight delay in relation to the drop of the foregoing potential, the voltage that is applied between the source-drain of the n-channel transistor NT12a and NT13a will increase. Nevertheless, the voltage will increase so that the division of voltage of the n-channel transistor NT13a and the division of voltage of the n-channel transistor NT12a will become approximately constant.

Meanwhile, if the applied voltage to the input signal line VINa decreases from the H level, the p-channel transistor PT11a shifts to an ON state, and the potential of the connection node VDP1a of the foregoing transistor and the p-channel transistor PT12a will rise. Since the potential of the output signal line VOUTa will rise with a slight delay in relation to the foregoing potential, the voltage that is applied between the source-drain of the p-channel transistors PT12a and PT13a will increase. Nevertheless, the voltage will rise so that the division of voltage of the p-channel transistor PT13a and the division of voltage of the p-channel transistor PT12a will become approximately constant.

FIG. 16B shows the voltage VDN12a=connection node VDN2a-connection node VDN1a that is applied between the source-drain of the n-channel transistor NT12a in relation to the applied voltage to the input signal line VIN. According to FIG. 16B, it is possible to understand that the voltage VDN12a changes within a range that does not exceed the intermediate range potential VM1a based on the voltage-dividing effect of the auxiliary voltage-dividing transistor NT13a. FIG. 16B also shows the voltage VDP12a=connection node VDP1a-connection node VDP2a that is applied between the source-drain of the p-channel transistor PT12a. It is possible to understand that the voltage VDP12a, as with the voltage VDN12a, changes within a range that does not exceed the intermediate range voltage VM1a based on the voltage-dividing effect of the auxiliary voltage-dividing transistor PT13a.

(3) Load Characteristics

Figure 17:
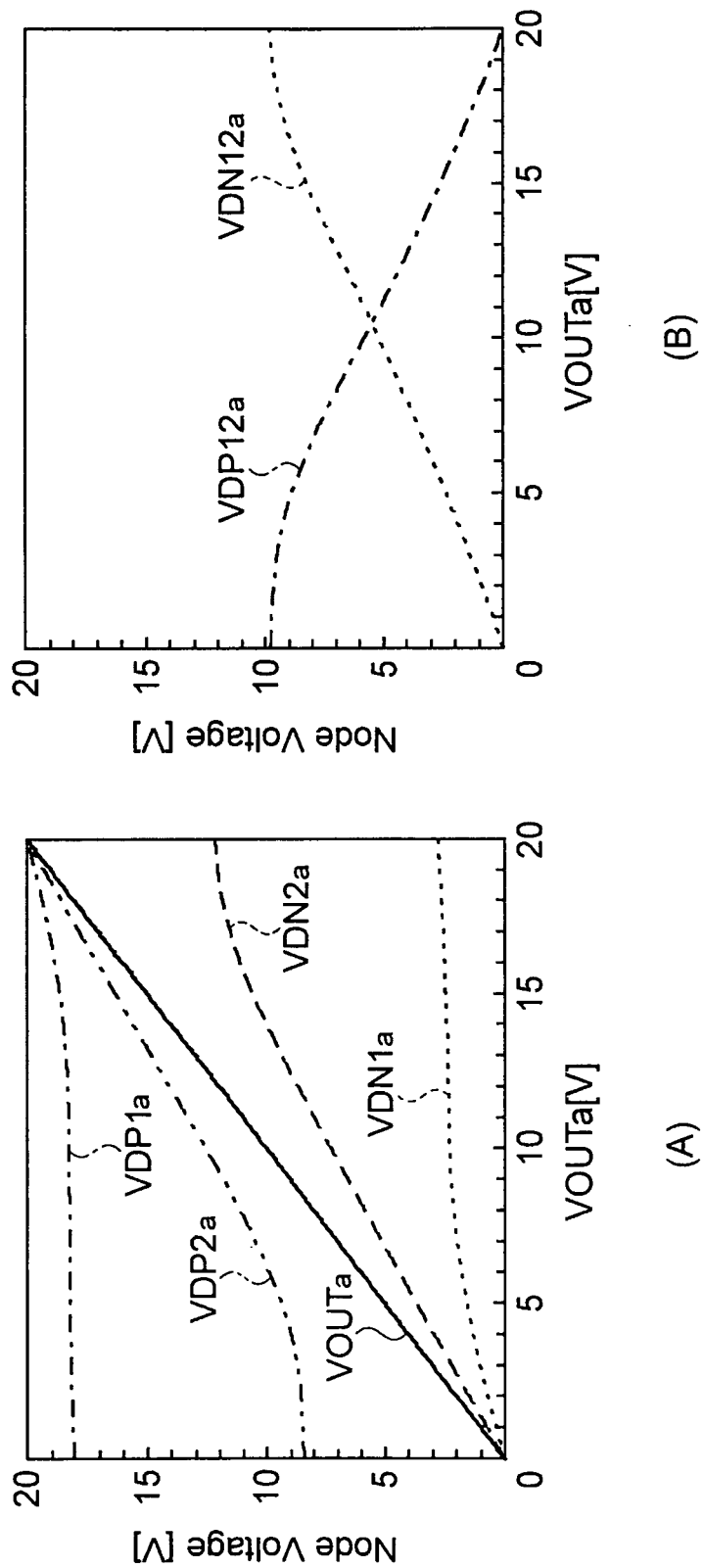
FIG. 17A and FIG. 17B are diagrams showing the output load characteristics of the inverter circuit of the third embodiment.

A case where a load is applied to the output signal line VOUTa is now considered. FIG. 17A shows the change of the connection nodes VDN1a and VDN2a of the n-channel transistors NT11a, NT12a and NT13a when an H level is input to the input signal line VINa and voltage of the grounding potential VSS to the power source potential VDD is applied to the output signal line VOUTa, and the change of the connection nodes VDP1a and VDP2a of the p-channel transistors PT11a, PT12a and PT13a when an L level is input to the input signal line VINa and the voltage of the power source potential VDD to the grounding potential VSS is applied to the output signal line VOUTa. According to FIG. 17A, when a load is applied to the output signal line VOUTa, the division of voltage of the n-channel transistor NT13a and the p-channel transistor PT13a increases so that the division of voltage of the n-channel transistor NT12a and the p-channel transistor PT12a does not become excessive. FIG. 17B shows the change of the voltages VDN12a and VDP12a that are applied between the source-drain of the n-channel transistor NT12a and the p-channel transistor PT12a under the operation conditions of FIG. 17A. According to FIG. 17B, it is possible to understand that the voltages VDN12a and VDP12a change within a range that does not exceed the intermediate range voltage VM1a based on the voltage-dividing effect of the n-channel transistor NT13a and the p-channel transistor PT13a as the voltage-dividing transistors. Consequently, as a result of cascade-connecting the drive transistors (PT11a and NT11a), the voltage-dividing transistors (PT12a and NT12a) and the auxiliary voltage-dividing transistors (PT13a and NT13a) to form an inverter circuit, the circuit can be operated without applying excessive voltage to the respective transistors not only when the voltage of the input signal line VINa is of an L level and H level, but also when an intermediate range voltage of these voltage levels is input, and also when a load is applied to the output signal line VOUTa.

Although FIG. 15 explained a case of providing one voltage-dividing transistor between the drive transistor and the auxiliary voltage-dividing transistor, the number of transistors may be two or more, and an intermediate range potential corresponding to the respective gates may be connected. As a result of increasing the number of transistors, voltage can be divided in multiple stages, and the voltage resistance that is demanded by the individual transistors can be designed to be lower.

Fourth Embodiment

Although a voltage-dividing transistor was applied as the inverter circuit in the third embodiment, this embodiment explains the application to the level shifter circuit. The circuit configuration is foremost explained, and the circuit operation is explained subsequently.

(1) Circuit Configuration

Figure 18:
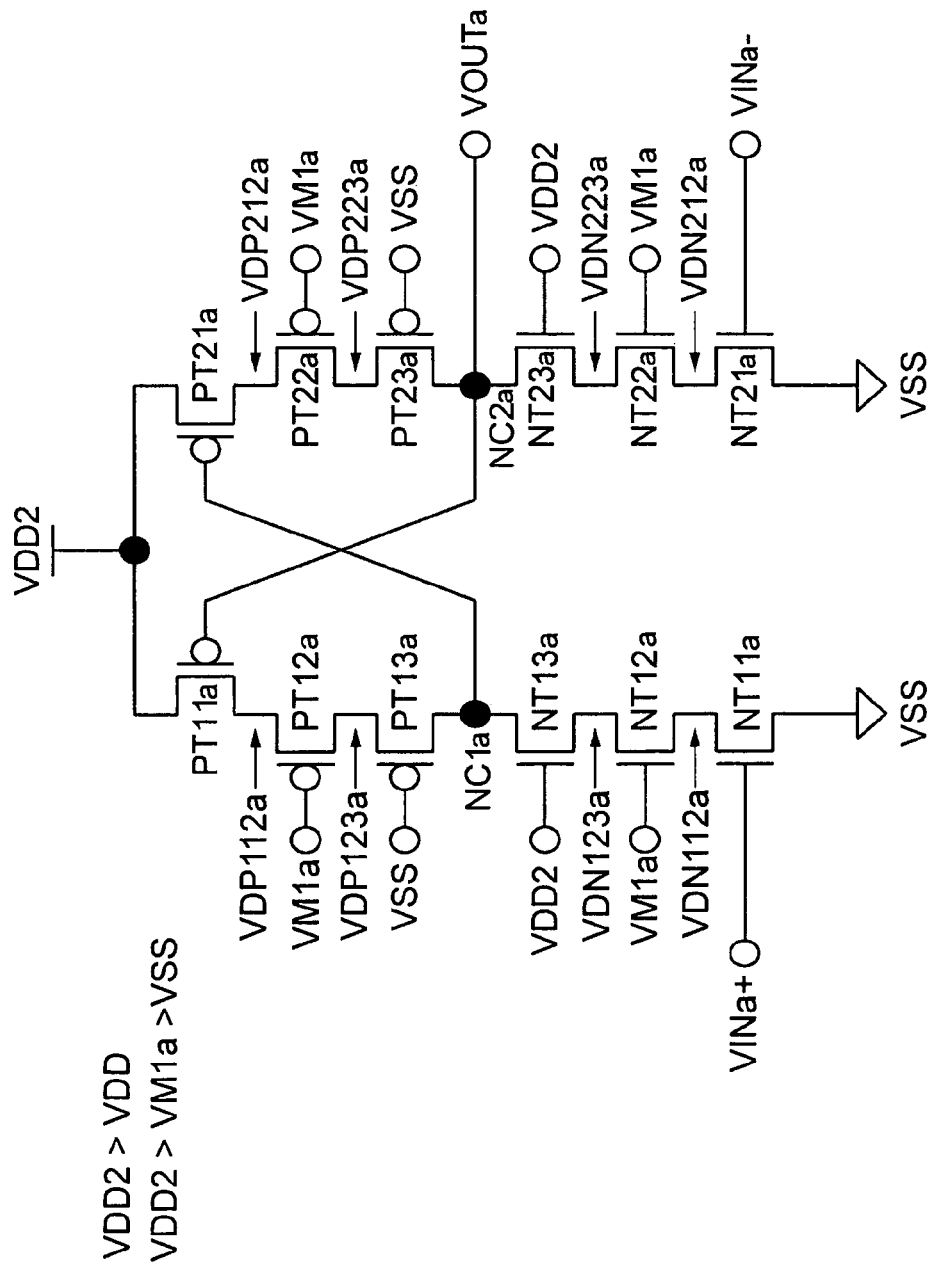
FIG. 18 is a circuit diagram showing the level shifter circuit (semiconductor integrated circuit) of the fourth embodiment.

FIG. 18 is a circuit diagram showing the level shifter circuit (semiconductor integrated circuit) of this embodiment.

A standard level shifter circuit comprises pairs of a p-channel transistor and an n-channel transistor; that is, a p-channel transistor PT11a and an n-channel transistor NT11a and a p-channel transistor PT21a and an n-channel transistor NT21a, that are connected in parallel between the second power source potential VDD2 and the grounding potential VSS, and these connection nodes NC1a and NC2a are cross-connected to the p-channel transistors PT21a and PT11a. The gate terminals of the n-channel transistors NT11a and NT21a are respectively connected to the input signal lines VINa+ and VINa− to which a complemented signal is input. In addition, the connection node NC2a is connected to the output signal line VOUTa.

Nevertheless, this embodiment includes two p-channel transistors PT12a and PT13a that are serially connected between the p-channel transistor PT11a connected to the second power source potential VDD2, and the connection node NC1a.

This embodiment additionally includes two p-channel transistors PT22a, PT23a that are cascade-connected between the p-channel transistor PT21a connected to the second power source potential VDD2, and the connection node NC2a.

This embodiment additionally includes two n-channel transistors NT12a, NT13a that are cascade-connected between the n-channel transistor NT11a connected to the grounding potential VSS, and the connection node NC1a.

This embodiment additionally includes two n-channel transistors NT22a, NT23a that are cascade-connected between the n-channel transistor NT21a connected to the grounding potential VSS, and the connection node NC2a.

Among the above, the gate terminals of the p-channel transistors PT13a and PT23a are connected to the grounding potential VSS.

Moreover, the gate terminals of the p-channel transistors PT12a and PT22a are connected to the intermediate range potential VM1a positioned between the second power source potential VDD2 and the grounding potential VSS. The intermediate range potential VM1a may be a fixed potential, or configured to apply an intermediate range potential VM1a for driving the device as described later.

The gate terminals of the n-channel transistor NT12a and NT22a are connected to the intermediate range potential VM1a positioned between the second power source potential VDD2 and the grounding potential VSS.

Further, the gate terminals of the n-channel transistors NT13a and NT23a are connected to the second power source potential VDD2.

Specifically, the relationship of the respective potentials will be the following relational expression (2):

$$\text{second power source potential } VDD2 > \text{intermediate range potential } VM1 > \text{grounding potential } VSS \quad (2)$$

So as long as the foregoing relational expression (2) is satisfied, there is no limitation on the spacing of these potentials, but it is preferable to make the spacing of the potentials to be approximately equal. Consequently, the potential that is applied between the source-drain of the p-channel transistors PT11a and PT12a, the p-channel transistors PT21a and PT22a, the n-channel transistors NT11a and NT12a, and the n-channel transistors NT21a and NT22a can be divided approximately evenly. The intermediate range potential VM1a that is applied to the p-channel transistors PT12a, PT22a and the intermediate range potential VM1a that is applied to the n-channel transistors NT12a, NT22a may be different potentials. However, by using common potentials, the drawing of the intermediate range potential is facilitated, and the circuit design can be simplified.

Incidentally, the p-channel transistors PT11a and PT21a and the n-channel transistors NT11a and NT21a are sometimes referred to as a "drive transistor," the p-channel transistors PT12a, PT22a and the n-channel transistors NT12a and NT22a are sometimes referred to as a "voltage-dividing transistor," and the p-channel transistors PT13a and PT23a and the n-channel transistors NT13a and NT23a are sometimes referred to as an "auxiliary voltage-dividing transistor."

(2) Circuit Operation

The circuit operation of the level shifter circuit is now explained with reference to FIG. 19A and FIG. 19B.

(2-a) First Operation

Figure 19:
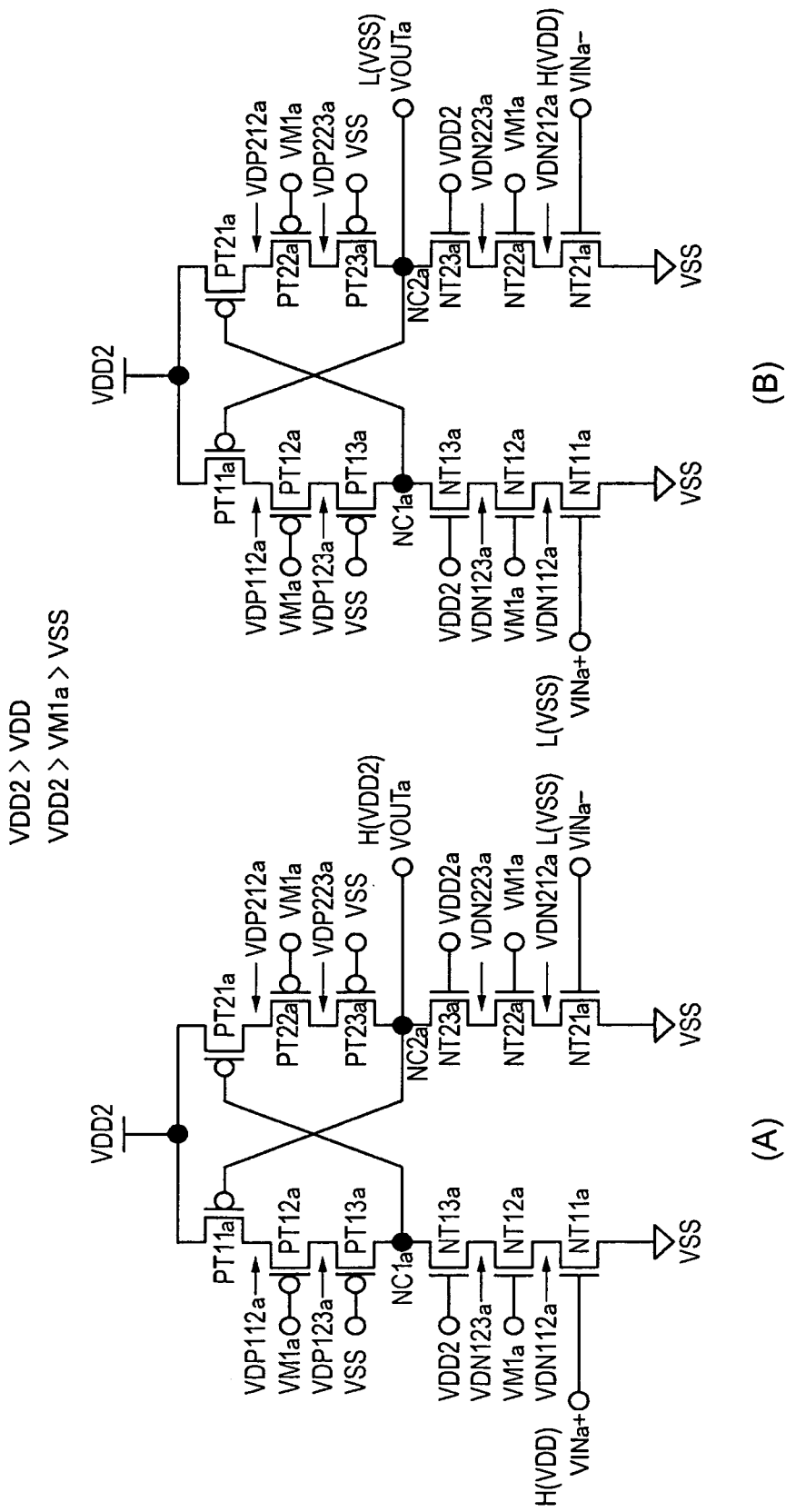
FIG. 19A and FIG. 19B are diagrams showing the operation of the level shifter circuit of the fourth embodiment.

As shown in FIG. 19A, when an H level potential is applied to the input signal line VINa+ and an L level potential is applied to the input signal line VINa−, the n-channel transistor NT11a becomes an ON state, and the connection node NC1a becomes an L level via the n-channel transistors NT12a and NT13a. Here, since the connection node NC1a is an L level, the p-channel transistor PT21a becomes an ON state, and a second power source potential VDD2 level signal is output from the output signal line VOUTa via the p-channel transistors PT22a and PT23a. Here, approximately 5V of H level (power source potential VDD level) is applied to VINa+, and the second power source potential VDD2 is, for example, 15V.

(2-b) Second Operation

Meanwhile, as shown in FIG. 19B, when an L level potential is applied to the input signal line VINa+ and an H level potential is applied to the input signal line VINa−, the n-channel transistor NT21a becomes an ON state, and an L level signal is output from the output signal line VOUTa via the n-channel transistors NT22a and NT23a. Here, since the connection node NC2a (output signal line VOUTa) is an L level, the p-channel transistor PT11a becomes an ON state, and the connection node NC1a becomes a second power source potential VDD2 level via the p-channel transistors PT12a and PT13a.

Based on the foregoing operation, the potential of 5V to 0V of the input signal line VINa+ to the input signal line VINa− can be level-shifted to the potential of 15V to 0V of the output signal line VOUTa.

(2-c) Voltage Resistance Improvement Effect

In the foregoing first operation, although the second power source potential VDD2=15V potential is applied to both ends of the p-channel transistors PT11a, PT12a and PT13a, since the intermediate range potential VM1a and the grounding potential VSS are respectively applied to the gate terminals of the p-channel transistors PT12a and PT13a, the connection nodes VDP112a and VDP123a of the p-channel transistors PT11a to PT13a will respectively become the applied intermediate range potential VM1a and the grounding potential VSS. Moreover, although the second power source potential VDD2=15V potential is also applied to both ends of the n-channel transistors NT21a, NT22a and NT23a, since the intermediate range potential VM1 and the second power source potential VDD2 are respectively applied to the gate terminals of the n-channel transistors NT22a and NT23a, the connection nodes VDN212a and VDN223a of the n-channel transistors NT21a to NT23a respectively become the applied intermediate range potential VM1 and the second power source potential VDD2.

Accordingly, voltage that is applied to the respective transistors PT11a to PT13a, NT21a to NT23a can be divided, and the voltage resistance of the level shifter circuit can be improved.

In the second operation also, although the second power source potential VDD2=15V potential is applied to both ends of the p-channel transistors PT21a, PT22a and PT23a, since the intermediate range potential VM1 and the grounding potential VSS are respectively applied to the p-channel transistors PT22a and PT23a, the connection nodes VDP212a and VDP223a of the p-channel transistors PT21a to PT23a respectively become the applied intermediate range potential VM1 and the grounding potential VSS. Moreover, although the second power source potential VDD2=15V potential is applied to both ends of the n-channel transistors NT11a, NT12a and NT13a, since the intermediate range potential VM1a and the second power source potential VDD2 are respectively applied to the n-channel transistors NT12a and NT13a, the connection nodes VDN112a and VDN123a of the n-channel transistors NT11a to NT13a respectively become the applied intermediate range potential VM1 and the second power source potential VDD2.

Accordingly, voltage that is applied to the respective transistors PT21a to PT23a, NT11a to NT13a can be divided, and the voltage resistance of the level shifter circuit can be improved.

Moreover, as with the first embodiment, the circuit is operated so that excessive voltage is not applied to the individual transistors based on the voltage-dividing effect of the auxiliary voltage-dividing transistors (p-channel transistor PT13a and PT23a, n-channel transistor NT13a and NT23a) in cases when an intermediate range potential of the input signal lines VINa+ and VINa− is input, and even in cases where a load is applied to the output signal line VOUTa.

Although FIG. 18 explained a case of providing one voltage-dividing transistor between the drive transistor and the auxiliary voltage-dividing transistor, the number of transistors may be two or more, and an intermediate range potential corresponding to the respective gates may be connected. As a result of increasing the number of transistors, voltage can be divided in multiple stages, the voltage resistance of the overall circuit can be improved, and the voltage resistance that is demanded by the individual transistors can be designed to be lower.

The third and fourth embodiments are suitable for high voltage drive circuits using low-temperature polysilicon TFT. A gate insulating film of a low-temperature polysilicon TFT has a voltage resistance limit of approximately 50[V] in cases where, for instance, the film thickness is approximately 100 [nm]. Meanwhile, although an LDD structure is generally used in order to improve the drain voltage resistance, the electrical field buffering effect is small in a thin film transistor having low-temperature polysilicon as the semiconductor layer. This is because the impurity concentration of the LDD structural part cannot be set low.

Specifically, the electrical field buffering effect will become greater if the impurity concentration of the LDD structural part is set low, but the lower limit thereof is approximately several times the residual defect density of the layer that is used as the semiconductor layer. In particular, a thin film transistor using low-temperature polysilicon has a high residual defect density at approximately 1017[/cm2], and the impurity concentration of the LDD structural part cannot be set low. Thus, there is a limit to the electrical field buffering effect based on the LDD structure.

If the low-temperature polysilicon TFT having the foregoing voltage resistance characteristics is applied to the third and fourth embodiments, the lowness of the drain voltage resistance that is inherent to the element can be supplemented with the circuit configuration, and a drive circuit with favorable voltage resistance characteristics can be configured. Moreover, if a thin film transistor structure is applied, since the voltage resistance and substrate bias effect between the substrate-source and drain will not arise as in a bulk transistor to the voltage-dividing transistor and auxiliary voltage-dividing transistor in which a high potential is applied to the source-drain, this is most preferable for the circuit configuration and circuit operation of this embodiment.

Including the third and fourth embodiments, the present invention configured from a drive transistor, a voltage-dividing transistor and an auxiliary voltage-dividing transistor configured only one the p-channel transistor side, or the n-channel transistor side can also be applied.

<Electro-Optic Device>

Although there is no limitation in the application of the semiconductor integrated circuit of the first and second embodiments, it can be suitably applied to a peripheral circuit of the following electro-optic device.

Figure 20:
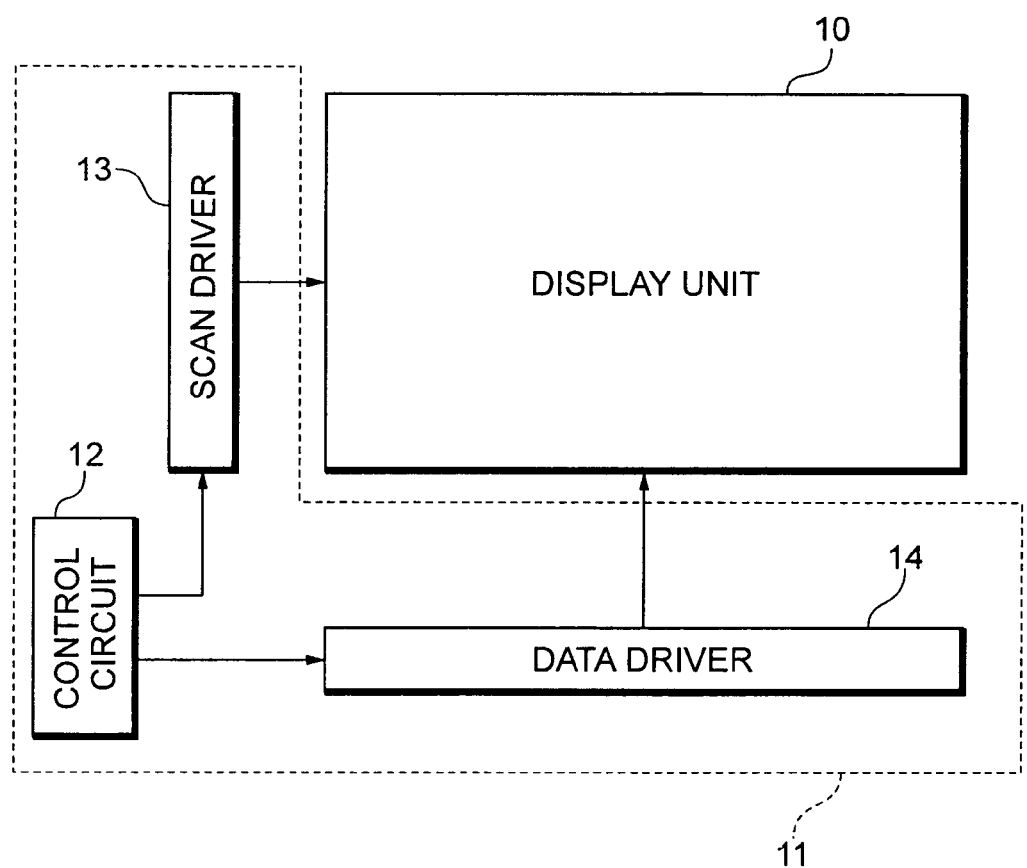
FIG. 20 is a block diagram showing the configuration of an electro-optic device.

FIG. 20 is a block diagram showing the configuration of the electro-optic device. This device comprises a display unit 10 and a peripheral circuit unit 11. The peripheral circuit unit 11 is provided with a scan driver 13, a data driver 14, and a control circuit 12 for controlling the foregoing components.

The control circuit 12, the scan driver 13 and the data driver 14 are configured from a TFT as with the transistor configuring the respective pixels of the display unit 10. Certain components of the peripheral circuit may be configured from independent electronic components; for instance, from an IC (integrated circuit) chip.

As the peripheral circuit, the inverter circuit or the level shifter circuit explained in detail in the foregoing embodiments is used. When configuring these circuits from TFT, voltage resistance can be improved by building them into the voltage-dividing transistor, whereby the device characteristics can also be improved.

Although there is no particular limitation in the electro-optic device, for instance, the semiconductor integrated circuit of the foregoing embodiments can be built into various electro-optic devices such as an organic EL device, a liquid crystal device, and an electrophoresis apparatus.

<Electronic Apparatus>

Figure 21:
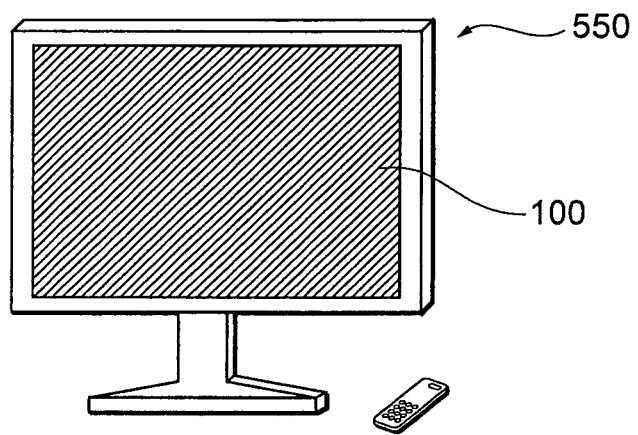
FIG. 21 is a perspective view of a television comprising the electro-optic device.
Figure 22:
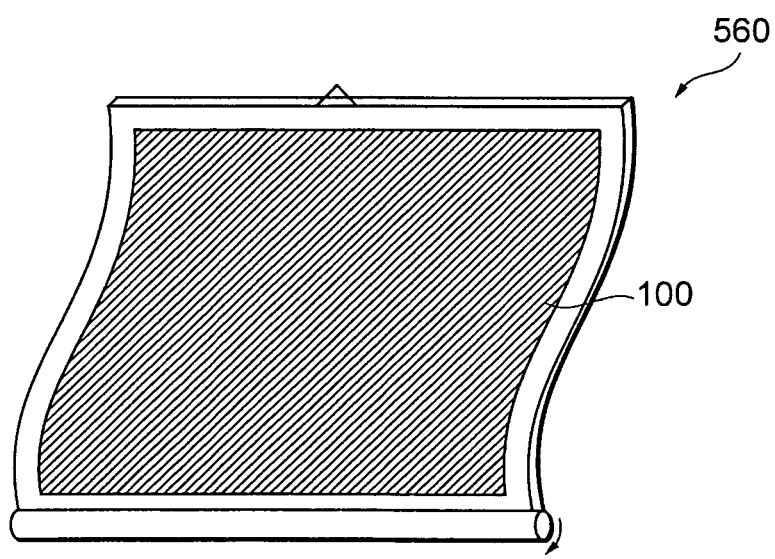
FIG. 22 is a perspective view of a roll-up television comprising the electro-optic device.
Figure 23:
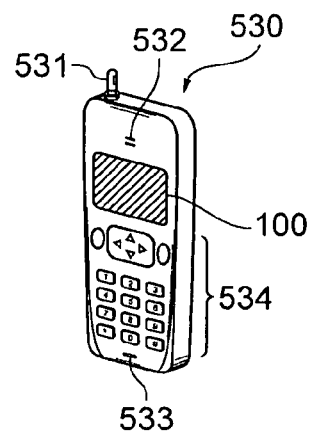
FIG. 23 is a perspective view of a mobile phone comprising the electro-optic device.
Figure 24:
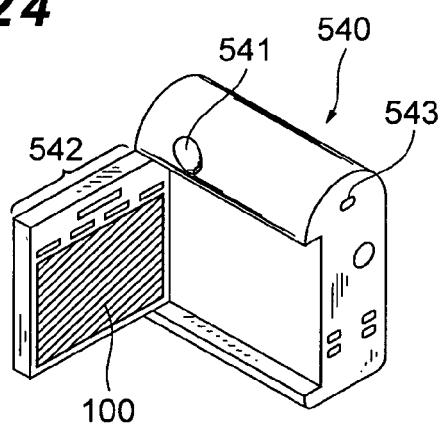
FIG. 24 is a perspective view of a video camera comprising the electro-optic device.
Figure 25:
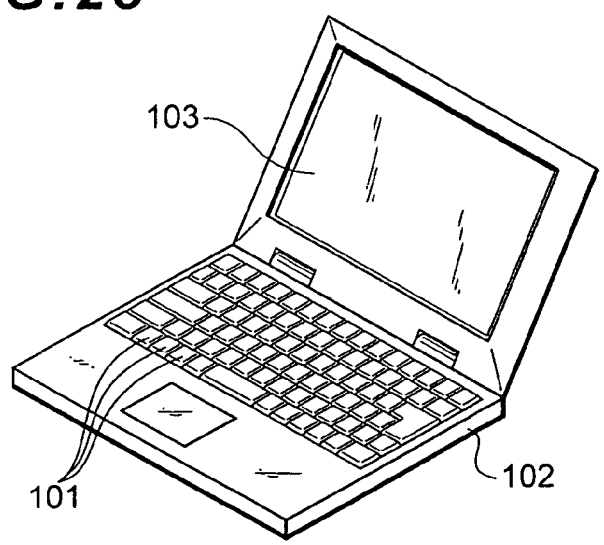
FIG. 25 is a perspective view of a personal computer comprising the electro-optic device.

Specific examples of the electronic apparatuses comprising the electro-optic device 100 are now explained with reference to FIG. 21 to FIG. 25. FIG. 21 shows the application to a television. The television 550 comprises the foregoing electro-optic device 100. FIG. 22 shows the application to a roll-up television. The roll-up television 560 comprises the foregoing electro-optic device 100. FIG. 23 shows the application to a mobile phone. The mobile phone 530 comprises an antenna unit 531, a sound output unit 532, a sound input unit 533, an operation unit 534, and the foregoing electro-optic device 100. FIG. 24 shows the application to a video camera. The video camera 540 comprises a receiver unit 541, an operation unit 542, a sound input unit 543, and the foregoing electro-optic device 100. FIG. 25 shows a mobile personal computer. The mobile personal computer comprises a main unit 102 including a keyboard 101, and a display unit 103 using the foregoing electro-optic device (for instance, an organic EL device).

The electronic apparatuses are not limited to the above, and the present invention can be applied to various electronic apparatuses having a display function. In addition to the above, the present invention can be applied to a facsimile machine with a display function, a finder of a digital camera, a portable TV, an electronic notebook, an electronic billboard, an advertisement display and the like.

According to the foregoing electronic apparatuses, the high voltage resistance of the devices can be sought, and a high voltage drive is enabled.

The present invention explained in detail above is not limited to the subject matter of the foregoing embodiments, and can be variously modified within the gist of the present invention.

<Mode of Application>

Similarly, although there is no particular limitation on the application of the semiconductor integrated circuit of the foregoing third and fourth embodiments, for instance, it can be suitably applied to the peripheral circuits of the following display device.

FIG. 26A is a block diagram showing the configuration of the display device. The display device 100a comprises a display unit 10a and a peripheral circuit unit 11a. The peripheral circuit unit 11a is provided with a scan driver 13a, a data driver 14a, and a control circuit 12a for controlling the foregoing components.

The control circuit 12a, the scan driver 13a and the data driver 14a are configured from a TFT as with the transistor configuring the respective pixels of the display unit 10a. Certain components of the peripheral circuit may be configured from independent electronic components; for instance, from an IC (integrated circuit) chip.

As the peripheral circuit, the inverter circuit or the level shifter circuit explained in detail in the foregoing embodiments is used. As an example, FIG. 26B shows the circuit block configuration of the scan driver 13a. The scan driver 13a is configured from a shift register 15a storing the scanning line data, and a level shifter 16a and an output buffer 17a for driving the scanning line of the pixel circuit of the display unit 10a according to the scanning line data. A circuit driven with a low voltage is applied to the shift register 15a. The circuit of the second embodiment is applied to the level shifter 16a, and the circuit of the first embodiment is applied to the output buffer 17a, respectively. Consequently, the scan driver 13a is able to drive the pixel circuit of the display unit 10a at a high voltage, while maintaining long-term reliability. The data driver 14a is also configured from a similar circuit block as the operation driver 13a.

Although there is no particular limitation in the display device, for instance, the semiconductor integrated circuit of the foregoing embodiments can be built into an organic EL device, a liquid crystal device, an electrophoresis apparatus or the like.

The semiconductor integrated circuit of the foregoing embodiments can also be applied to the television shown in FIG. 21.

The electronic apparatuses are not limited to the above, and the present invention can also be applied to various electronic apparatuses with a display function.

According to the foregoing electronic apparatuses, the high voltage resistance of the devices can be sought, and a high voltage drive is enabled.

The present invention explained in detail above is not limited to the subject matter of the foregoing embodiments, and can be variously modified within the gist of the present invention.

As a result of adding an auxiliary voltage-dividing transistor to a conventional high voltage drive circuit configured by cascade-connecting a drive transistor and a voltage-dividing transistor, it is possible to avoid excessive stress from being applied to a specific transistor under transitional situations such as when the I/O signal is switched, and even when the circuit is operated under a high load state. Thus, it is possible to realize a high voltage drive semiconductor integrated circuit with long-term reliability and high practical application, and expand the scope of application thereof.

What is claimed is:

1. A semiconductor integrated circuit, comprising:
   a first node coupled between a first potential node and a second potential node, the first potential node having a first potential and the second potential node having a second potential, the second potential being lower than the first potential;
   a first voltage-dividing circuit arranged between the first potential node and the first node; and
   a second voltage-dividing circuit arranged between the first node and the second potential node,
   the first voltage-dividing circuit comprising a first p-channel transistor and a second p-channel transistor,
   the first and second p-channel transistors being coupled in series between the first potential node and the first node and both having one end, another end, and a gate terminal,
   the one end of the first p-channel transistor being coupled to the first potential node, the another end of the first p-channel transistor being coupled to the one end of the second p-channel transistor, and the gate terminal of the first p-channel transistor being coupled to a second node, the another end of the second p-channel transistor being coupled to the first node and the gate terminal of the second p-channel transistor being applied with a first intermediate range potential having a potential between the first potential and the second potential,
   the second voltage-dividing circuit comprising a first n-channel transistor and a second n-channel transistor,
   the first and second n-channel transistors being coupled in series between the first node and the second potential node and both having one end, another end, and a gate terminal,
   the one end of the first n-channel transistor being coupled to the second potential node, the another end of the first n-channel transistor being coupled to the one end of the second n-channel transistor, and the gate terminal of the first n-channel transistor being coupled to the second node,
   the another end of the second n-channel transistor being coupled to the first node and the gate terminal of the second n-channel transistor being applied with the first intermediate range potential, wherein the first intermediate range potential is different from a potential of the first node.

2. The semiconductor integrated circuit according to claim 1, further comprising:
   a third n-channel transistor having one end and another end, the one end of the third re-channel transistor being coupled to the first node and the another end of the third n-channel transistor being coupled to the another end of the second n-channel transistor, a gate terminal of the third n-channel transistor being applied with a second intermediate range potential having a higher potential than the first intermediate range potential, the second intermediate range potential having a potential between the first potential node and the second potential node.

3. The semiconductor integrated circuit according to claim 1, further comprising:
   a third p-channel transistor coupled between the first node and the one end of the second p-channel transistor, a gate terminal of the third p-channel transistor being applied with a second intermediate range potential having a lower potential than the first intermediate range potential, the second intermediate range potential having a potential between the first potential node and the second potential node.

4. A method for driving a semiconductor integrated circuit, including a first node coupled between a first potential node and a second potential node, the first potential node having a first potential and the second potential node having a second potential, the second potential being lower than the first potential; a first voltage-dividing circuit arranged between the first potential node and the first node; and a second voltage-dividing circuit arranged between the first node and the second potential node, the first voltage-dividing circuit comprising a first p-channel transistor and a second p-channel transistor, the first and second p-channel transistors being coupled in series between the first potential node and the first node and both having one end, another end, and a gate terminal, the one end of the first p-channel transistor being coupled to the first potential node, the another end of the first p-channel transistor being coupled to the one end of the second p-channel transistor, and the gate terminal of the first p-channel transistor being coupled to a second node, the another end of the second p-channel transistor being coupled to the first node and the gate terminal of the second p-channel transistor being applied with a first intermediate range potential having a potential between the first potential and the second potential, the second voltage-dividing circuit comprising a first n-channel transistor and a second n-channel transistor, the first and second n-channel transistors being coupled in series between the first node and the second potential node and both having one end, another end, and a gate terminal, the one end of the first n-channel transistor being coupled to the second potential node, the another end of the first n-channel transistor being coupled to the one end of the second n-channel transistor, and the gate terminal of the first n-channel transistor being coupled to the second node, the another end of the second n-channel transistor being coupled to the first node and the gate terminal of the second n-channel transistor being applied with the first intermediate range potential, wherein the first intermediate range potential is different from a potential of the first node, the method comprising:

applying a first intermediate range potential having a potential between the first potential node and the second potential node to a gate terminal of the second n-channel transistor upon outputting a signal of a power source potential level from the first node when a signal input to a gate terminal of the first n-channel transistor has a grounding potential level.

5. The method for driving a semiconductor integrated circuit according to claim 4, the semiconductor integrated circuit further including a third re-channel transistor coupled between the first node and the one end of the second n-channel transistor, the method further comprises:

applying a second immediate range potential having a potential between the first potential node and the second potential node to a gate terminal of the third n-channel transistor upon outputting of a signal of a power source potential level.

6. The method for driving a semiconductor integrated circuit according to claim 4, the semiconductor integrated circuit further including a third p-channel transistor coupled between the first node and the one end of the second p-channel transistor, the method further comprises:

applying a second intermediate range potential that is a lower potential than the first intermediate range potential to a gate terminal of the third p-channel transistor upon outputting the signal of a grounding potential level, the first intermediate range potential having a potential between the first potential node and the second potential node.

* * * * *